(12) United States Patent
Yonemura et al.

(10) Patent No.: US 8,872,156 B2
(45) Date of Patent: Oct. 28, 2014

(54) GROUP III NITRIDE SEMICONDUCTOR LIGHT EMITTING DEVICE AND METHOD OF FABRICATING GROUP III NITRIDE SEMICONDUCTOR LIGHT EMITTING DEVICE

(75) Inventors: Takumi Yonemura, Osaka (JP); Takashi Kyono, Itami (JP); Yohei Enya, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/453,718

(22) Filed: Apr. 23, 2012

(65) Prior Publication Data
US 2013/0020551 A1 Jan. 24, 2013

(30) Foreign Application Priority Data

Jul. 21, 2011 (JP) ................................ P2011-160077

(51) Int. Cl.
*H01L 29/16* (2006.01)
*H01L 29/20* (2006.01)
(Continued)

(52) U.S. Cl.
CPC ............ *H01S 5/3202* (2013.01); *H01S 5/3063* (2013.01); *H01S 5/34333* (2013.01); *H01S 5/0421* (2013.01); *H01L 33/32* (2013.01); *H01L 21/0262* (2013.01); *H01S 5/0035* (2013.01); *H01L 21/02554* (2013.01); *H01S 5/2009* (2013.01); *H01L 33/16* (2013.01); *H01S 5/3211* (2013.01); *H01L 21/02579* (2013.01); *H01S 5/3054* (2013.01)
USPC .................. 257/13; 257/21; 257/76; 257/77; 257/194; 257/329; 438/478; 438/572; 438/285

(58) Field of Classification Search
USPC ............ 257/13, 21, 76, 77, 194, 329; 438/22, 438/46, 478, 572, 285
See application file for complete search history.

(56) References Cited

U.S. PATENT DOCUMENTS 8,227,277 B2 * 7/2012 Yoshizumi et al. ............. 438/33
2003/0039286 A1 * 2/2003 Doi et al. ........................ 372/45
(Continued)

FOREIGN PATENT DOCUMENTS

JP 2000-164925 6/2000
JP 2010-103471 5/2010
(Continued)

OTHER PUBLICATIONS

Enya et al., "531 nm Green Lasing of InGaN Based Laser Diodes on Semi-Polar {20-21} Free-Standing GaN Substrates," Applied Physics Express, vol. 2, No. 8, pp. 082101-1-082101-3 (2009).
(Continued)

*Primary Examiner* — Shaun Campbell
*Assistant Examiner* — Thai T Vuong
(74) *Attorney, Agent, or Firm* — Venable LLP; Michael A. Sartori; F. Brock Riggs

(57) ABSTRACT

A group III nitride semiconductor light emitting device includes an n-type cladding layer and a p-type cladding layer on a primary surface of a substrate, the c-axes of which tilt relative to the normal axis of the primary surface of the substrate. The p-type cladding layer is doped with a p-type dopant providing an acceptor level, and the p-type cladding layer contains an n-type impurity providing a donor level. An active layer is disposed between the n-type cladding layer and the p-type cladding layer. The concentration of the p-type dopant is greater than that of the n-type impurity. The difference (E(BAND)−E(DAP)) between the energy E(BAND) of a band-edge emission peak value in the photoluminescence spectrum of the p-type cladding layer and the energy E(DAP) of a donor-acceptor pair emission peak value in the photoluminescence spectrum is not more than 0.42 electron volts.

17 Claims, 11 Drawing Sheets

(51) Int. Cl.
*H01L 29/872* (2006.01)
*H01L 29/78* (2006.01)
*H01L 31/0352* (2006.01)
*H01S 5/343* (2006.01)
*H01L 21/02* (2006.01)
*H01S 5/32* (2006.01)
H01S 5/30 (2006.01)
H01S 5/042 (2006.01)
H01L 33/32 (2010.01)
H01S 5/00 (2006.01)
H01S 5/20 (2006.01)
H01L 33/16 (2010.01)

(56) References Cited

U.S. PATENT DOCUMENTS

| | | | |
|---|---|---|---|
| 2005/0230690 A1* | 10/2005 | Hata | 257/79 |
| 2008/0073660 A1* | 3/2008 | Ohno et al. | 257/97 |
| 2008/0199983 A1* | 8/2008 | Nakamura et al. | 438/33 |
| 2008/0230766 A1* | 9/2008 | Okamoto et al. | 257/13 |
| 2009/0059983 A1* | 3/2009 | Hasegawa et al. | 372/44.01 |
| 2009/0268768 A1* | 10/2009 | Ueno et al. | 372/43.01 |
| 2009/0310640 A1* | 12/2009 | Sato et al. | 372/45.011 |
| 2010/0080001 A1* | 4/2010 | Kunoh et al. | 362/259 |
| 2010/0190284 A1* | 7/2010 | Enya et al. | 438/47 |
| 2011/0017974 A1* | 1/2011 | Ahn | 257/13 |
| 2011/0064103 A1* | 3/2011 | Ohta et al. | 372/45.01 |

FOREIGN PATENT DOCUMENTS

| | | |
|---|---|---|
| JP | 2010-212651 | 9/2010 |
| JP | 2011-023541 | 2/2011 |
| JP | 2011-135016 | 7/2011 |
| WO | WO-2010/103674 A1 | 9/2010 |

OTHER PUBLICATIONS

International Preliminary Report on Patentability and Written Opinion in PCT International Application No. PCT/JP2012/059580, dated Jan. 30, 2014.

* cited by examiner

Fig.2
(a)
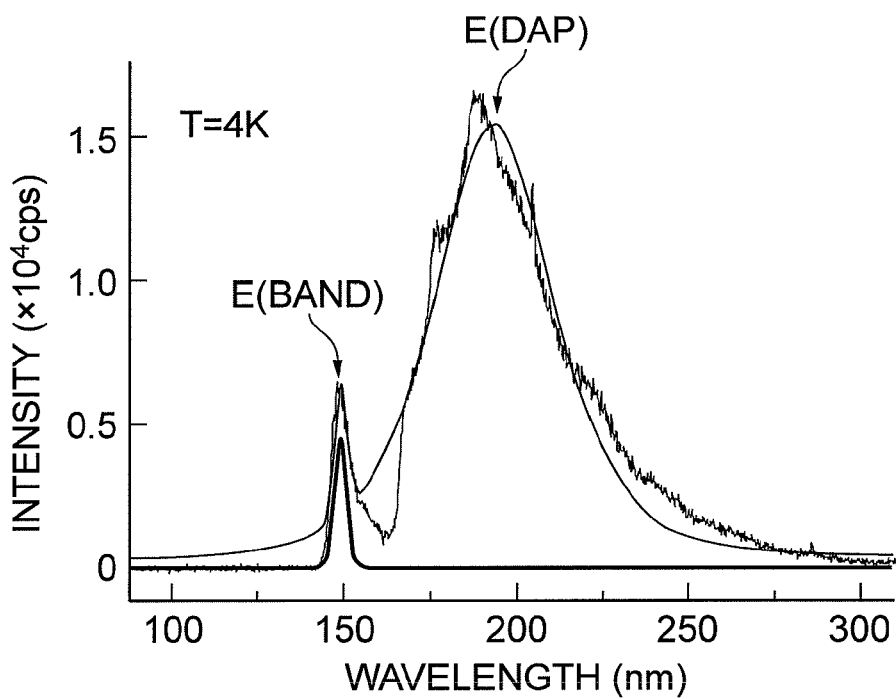
(b)
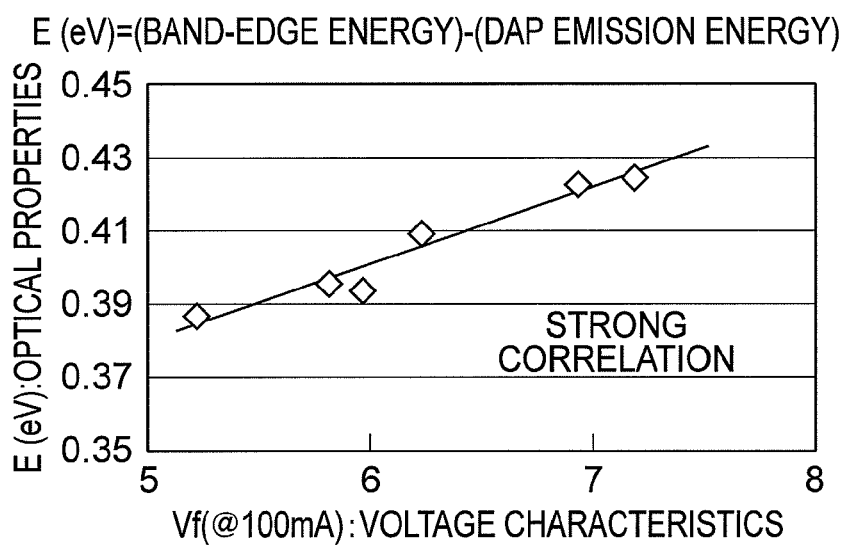

Fig.5
(a)
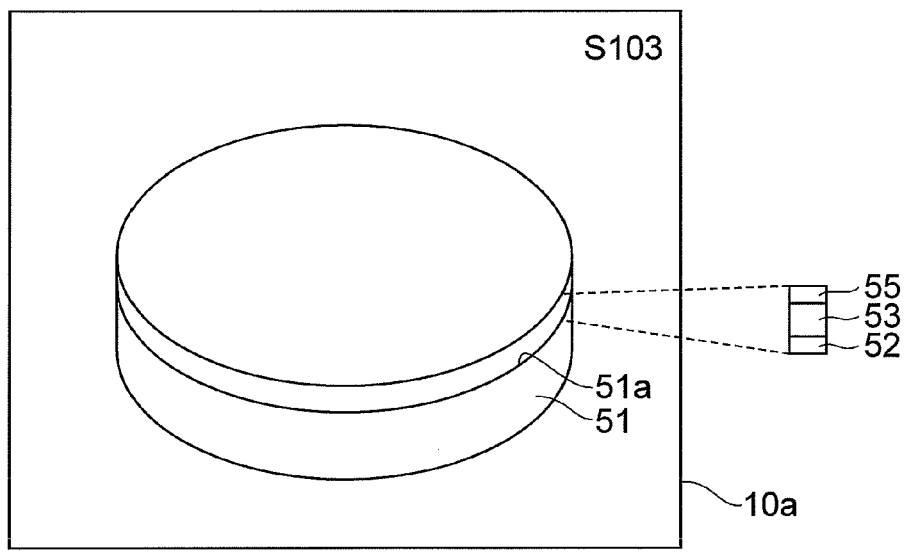
(b)
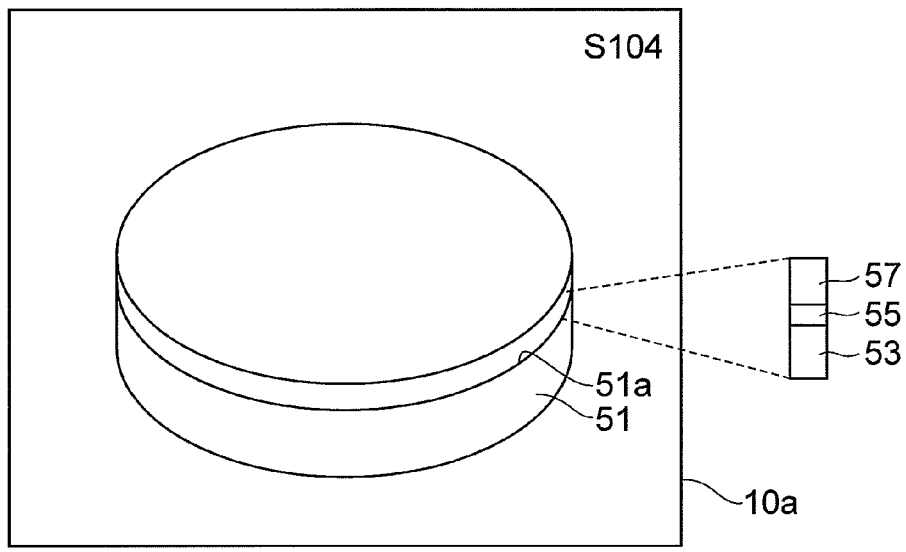

Fig.6
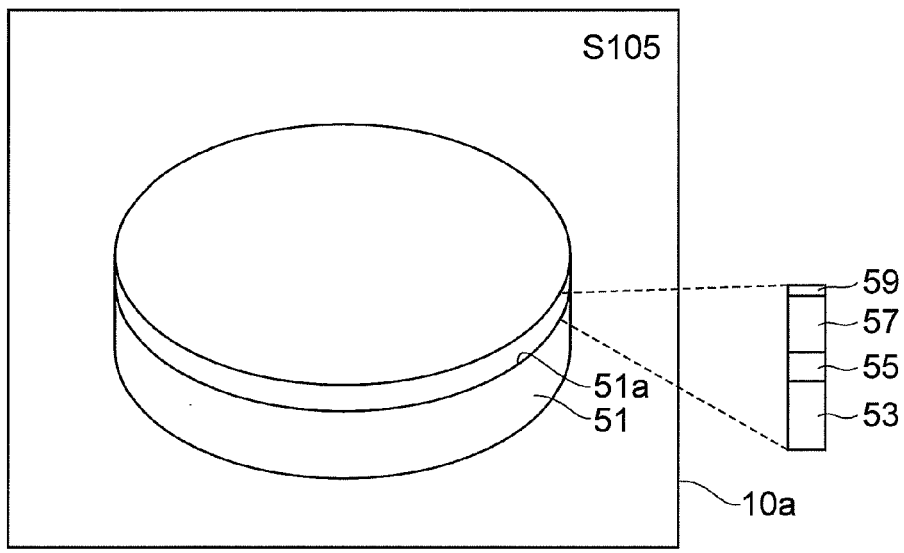
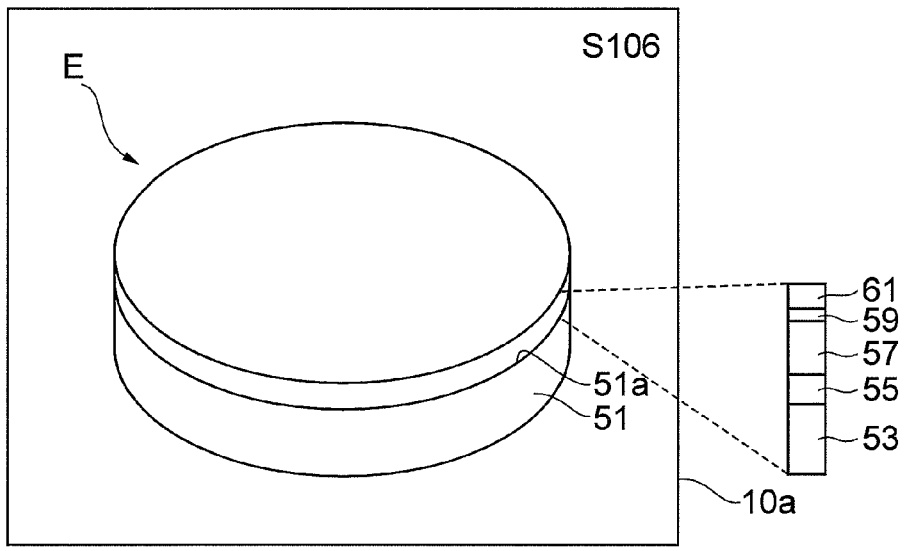

| p+GaN 0.050 μm Mg=3E+20 | p-In0.03Al0.14Ga0.83N 0.4 μm | p-GaN 0.200 μm | p-In0.03Ga0.97N 0.050 μm | p-GaN 0.020 μm | ud-In0.03Ga0.97N 0.075 μm | n-In0.03Ga0.97N 0.115 μm | n-GaN 0.250 μm | n-In0.03Al0.14Ga0.83N 1.2 μm | n-GaN 1.1 μm | GaN substrate |
|---|---|---|---|---|---|---|---|---|---|---|

(b)

| p+GaN 0.010 μm Mg=3E+20 | p+GaN 0.040 μm Mg=3E+19 | p-In0.03Al0.14Ga0.83N 0.4 μm | p-GaN 0.200 μm | p-In0.03Ga0.97N 0.050 μm | p-GaN 0.020 μm | ud-In0.03Ga0.97N 0.075 μm | n-In0.03Ga0.97N 0.115 μm | n-GaN 0.250 μm | n-In0.03Al0.14Ga0.83N 1.2 μm | n-GaN 1.1 μm | GaN substrate |
|---|---|---|---|---|---|---|---|---|---|---|---|

Fig.11
(a)
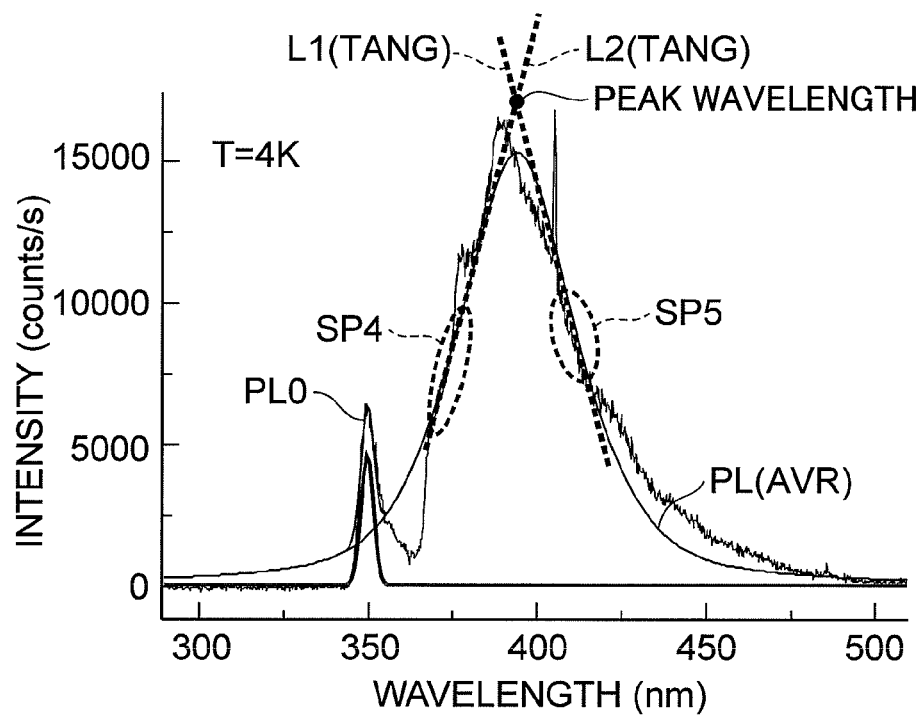
(b)
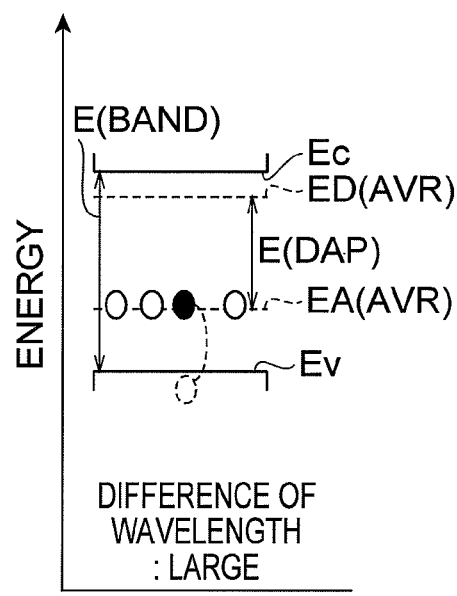
(c)
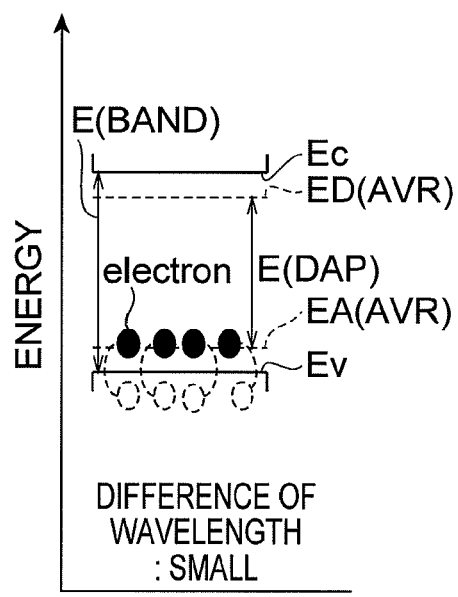

GROUP III NITRIDE SEMICONDUCTOR LIGHT EMITTING DEVICE AND METHOD OF FABRICATING GROUP III NITRIDE SEMICONDUCTOR LIGHT EMITTING DEVICE

BACKGROUND OF THE INVENTION

1. Field of the Invention

The present invention relates to a group III nitride semiconductor light emitting device and a method of fabricating the group III nitride semiconductor light emitting device.

2. Related Background Art

Non-patent Literature 1 discloses a gallium nitride-based semiconductor laser which emits green light.

Non-patent Literature 1: Enya Yohei, Yoshizumi Yusuke, Kyono Takashi, Akita Katsushi, Ueno Masaki, Adachi Masahiro, Sumitomo Takamichi, Tokuyama Shinji, Ikegami Takatoshi, Katayama Koji, Nakamura Takao, "531 nm Green Lasing of InGaN Based Laser Diodes on Semi-Polar {20-21} Free-Standing GaN Substrates," Applied Physics Express, Volume 2, Issue 8, pp. 082101 (2009)

SUMMARY OF THE INVENTION

Electrical properties, which are factors that affect the performance of a laser diode, have been evaluated, for example, through the evaluation of the electrical properties of the laser diode itself, or through the evaluation of the electrical properties of a single-layer semiconductor film for a p-type cladding layer or a p-type guide layer. Such evaluations of the properties are used to control the electrical characteristics of the laser diode.

According to the findings of the present inventors, the p-type cladding layer and the p-type guide layer significantly contribute to the electrical properties of the laser diode. If the electrical properties of the p-type cladding layer can be independently evaluated in the laser diode structure, the electrical properties of the laser diode can be controlled more accurately. In other words, it is desirable to evaluate the electrical properties of the p-type cladding layer in the laser diode independently.

More accurate evaluation on the electrical properties of the p-type cladding layer allows for providing a laser diode and a light emitting diode with improved electrical properties.

It is an object for one aspect of the present invention to provide a group III nitride semiconductor light emitting device having reduced forward voltage, and it is an object for another aspect of the present invention to provide a method of fabricating the group III nitride semiconductor light emitting device.

A group III nitride semiconductor light emitting device according to the present invention comprises: (a) an n-type cladding layer provided on a primary surface of a substrate, the n-type cladding layer comprising an n-type group III nitride semiconductor; (b) an active layer provided on the primary surface of the substrate, the active layer comprising a group III nitride semiconductor; and (c) a p-type cladding layer provided on the primary surface of the substrate, the p-type cladding layer comprising a p-type group III nitride semiconductor. The active layer is provided between the n-type cladding layer and the p-type cladding layer; the n-type cladding layer, the active layer, and the p-type cladding layer are arranged along a normal axis of the primary surface of the substrate; the p-type cladding layer is doped with a p-type dopant, the p-type dopant providing an acceptor level; the p-type cladding layer contains an n-type impurity, the n-type impurity providing a donor level; a concentration of the p-type dopant is greater than that of the n-type impurity; the difference (E(BAND)−E(DAP)) between the energy E(BAND) of a band-edge emission peak value in a photoluminescence spectrum of the p-type cladding layer and the energy E(DAP) of a donor-acceptor pair emission peak value in the photoluminescence spectrum is not more than 0.42 electron volts, where the energy E(BAND) of the band-edge emission and the energy E(DAP) of a donor-acceptor pair emission are represented in units of electron volts; a c-axis of the n-type group III nitride semiconductor of the n-type cladding layer is inclined away from the normal axis; and a c-axis of the p-type group III nitride semiconductor of the p-type cladding layer is inclined away from the normal axis.

In the group III nitride semiconductor light emitting device, the n-type cladding layer, the active layer, and the p-type cladding layer are arranged along the normal axis of the primary surface of the substrate, the c-axis of the n-type group III nitride semiconductor of the n-type cladding layer and the c-axis of the p-type group III nitride semiconductor of the p-type cladding layer both tilt relative to the normal axis, and the active layer is provided between the n-type cladding layer and the p-type cladding layer. In the group III nitride semiconductor light emitting device, the p-type cladding layer contains a p-type dopant and an n-type impurity such that the concentration of the p-type dopant is greater than that of the n-type impurity in the p-type cladding layer. Thus, the photoluminescence spectrum measured with excitation light having a higher energy than the band gap of the p-type cladding layer has peaks of a band-edge emission and a donor-acceptor pair emission. The studies by the present inventors have demonstrated that the difference (E(BAND)−E(DAP)) between the energy E(BAND) of a band-edge emission peak value in the photoluminescence spectrum and the energy E(DAP) of a donor-acceptor pair emission peak value in the photoluminescence spectrum has a correlation with the driving voltage of the group III nitride semiconductor light emitting device. At an energy difference (E(BAND)−E(DAP)) of not more than 0.42 electron volts, the driving voltage in application of the forward voltage can be reduced compared to the conventional group III nitride semiconductor light emitting device.

In the group III nitride semiconductor light emitting device according to the present invention, preferably the p-type dopant includes magnesium and the magnesium concentration is $3\times10^{18}$ cm$^{-3}$ or more.

According to the group III nitride semiconductor light emitting device, the carriers that provides electrical conduction in the p-type cladding layer are holes. A magnesium concentration of not more than $3\times10^{18}$ (3E+18) cm$^{-3}$ can provide a carrier concentration for the electrical conduction in such a level to maintain satisfactory voltage characteristics of the group III nitride semiconductor layer, thus advantageously providing the PL spectrum with an energy difference of not more than 0.42 eV.

In the group III nitride semiconductor light emitting device according to the present invention, preferably the n-type impurity includes oxygen and the oxygen concentration is $6\times10^{17}$ cm$^{-3}$ or less.

According to the group III nitride semiconductor light emitting device, the oxygen can function as an electron donor, while carriers taking the role of electrical conduction in the p-type cladding layer are holes. An oxygen concentration of $6\times10^{17}$ cm$^{-3}$ or less can prevent carrier compensation in the p-type cladding layer, so that carriers from the activated acceptors can provide electrical conduction. An oxygen concentration of not more than $6\times10^{17}$ cm$^{-3}$ can advantageously produce an energy difference (E(BAND)−E(DAP)) of 0.42 electron volts or less.

In the group III nitride semiconductor light emitting device according to the present invention, preferably the p-type cladding layer includes an InAlGaN layer and the InAlGaN layer has a thickness of 180 nm or more.

According to the group III nitride semiconductor light emitting device, in order to evaluate the voltage characteristics of a quaternary InAlGaN layer for the p-type cladding layer at high accuracy, preferably the proportion of the cladding component contained in the photoluminescence spectrum (signal component derived from excitation in the cladding layer) is 90% or more. At a thickness of the p-type cladding layer of not less than 0.18 μm, the p-type cladding layer can provide sufficiently strong spectra for signal components from other p-types of semiconductor layers.

In the group III nitride semiconductor light emitting device according to the present invention, the n-type cladding layer preferably includes an InAlGaN layer. The group III nitride semiconductor light emitting device in which the n-type cladding layer includes the InAlGaN layer can provide good optical confinement.

In the group III nitride semiconductor light emitting device according to the present invention, the angle defined by the normal axis of and the c-axis of the p-type group III nitride semiconductor of the p-type cladding layer can be in the range of 10 degrees to 80 degrees or in the range of 100 degrees to 170 degrees.

According to the group III nitride semiconductor light emitting device, the group III nitride semiconductor exhibits properties based on a semi-polar plane rather than on the polar c-plane. Thus, the electrical properties of the group III nitride semiconductor light emitting device on the semi-polar plane is different from those of a group III nitride semiconductor light emitting device formed on the c-plane.

In the group III nitride semiconductor light emitting device according to the present invention, preferably the p-type cladding layer includes indium and aluminum as the group III elements, and the angle defined by the normal axis and the c-axis of the p-type group III nitride semiconductor of the p-type cladding layer is in the range of 63 degrees to 80 degrees or in the range of 100 degrees to 117 degrees.

According to the group III nitride semiconductor light emitting device, the incorporation of indium in the group III nitride semiconductor of the p-type cladding layer is enhanced in an off-angle inclined relative to the c-plane is in the range of 63 degrees to 80 degrees (or in the range of 100 degrees to 117 degrees), whereby the group III nitride semiconductor light emitting device can include the cladding layer with excellent crystal quality. Furthermore, the cladding layer with an off-angle in this range can provide an energy difference (E(BAND)−E(DAP)) of not more than 0.42 electron volts, more readily than the p-type cladding layer with an off-angle outside the range.

In the group III nitride semiconductor light emitting device according to the present invention, the emission spectrum of the active layer preferably has a peak wavelength in the range of 500 nm to 580 nm.

According to the group III nitride semiconductor light emitting device, the active layer provides light emission of peak wavelength in green and its adjacent wavelength region (in the range of 500 nm to 580 nm) using the semi-polar plane. The light emitting device is provided with a reduced forward voltage.

The group III nitride semiconductor light emitting device according to the present invention can further include a p-type contact layer provided on the p-type cladding layer. Preferably, the thickness of the p-type contact layer is not more than 0.06 micrometers, the p-type contact layer includes a p-type group III nitride semiconductor, the band gap of the p-type group III nitride semiconductor of the p-type contact layer is smaller than the band gap of the p-type group III nitride semiconductor of the p-type cladding layer, and the p-type dopant concentration of the p-type contact layer is greater than that of the p-type cladding layer.

According to the group III nitride semiconductor light emitting device, in order to evaluate the voltage characteristics of the group III nitride semiconductor for the p-type cladding layer at high accuracy, preferably the proportion of the cladding component contained in the photoluminescence spectrum (signal component due to excitation in the cladding layer) is 90% or more. At a thickness of the p-type contact layer of 0.06 micrometers or less, the contact component from the p-type contact layer does not have a large proportion relative to the cladding component, thus effectively reducing the proportion of the contact component contained in the photoluminescence spectrum to about 10% or less.

In the group III nitride semiconductor light emitting device according to the present invention, preferably the p-type contact layer is composed of p-type GaN and the p-type dopant concentration of the p-type contact layer is $1\times10^{19}$ cm$^{-3}$ or more. According to the group III nitride semiconductor light emitting device, when the p-type dopant concentration of the p-type GaN is $1\times10^{19}$ cm$^{-3}$ or more, the contact component from the p-type contact layer does not have a large proportion relative to the cladding component, thus effectively reducing the proportion of the contact component contained in the photoluminescence spectrum to about 10% or less.

In the group III nitride semiconductor light emitting device according to the present invention, preferably the p-type contact layer includes a first group III nitride semiconductor layer of p-type conductivity and a second group III nitride semiconductor layer of p-type conductivity; the second group III nitride semiconductor layer is provided between the first group III nitride semiconductor layer and the p-type cladding layer; the p-type dopant concentration of the first group III nitride semiconductor layer is greater than that of the second group III nitride semiconductor layer; and the p-type dopant concentration of the p-type cladding layer is smaller than that of the second group III nitride semiconductor layer. The group III nitride semiconductor light emitting device can further include an anode electrode in contact with the first group III nitride semiconductor layer.

According to the group III nitride semiconductor light emitting device, the p-type contact layer, which is not limited to a single layer, includes a first III nitride semiconductor layer and a second III nitride semiconductor layer, and these III nitride semiconductor layers have different p-type dopant concentrations from each other.

In the group III nitride semiconductor light emitting device according to the present invention, the primary surface of the substrate is composed of III nitride, and the normal axis of the primary surface of the substrate preferably is inclined relative to the c-axis of the III nitride of the substrate. The group III nitride semiconductor light emitting device is provided with a multilayered semiconductor stacked along the normal axis of the so-called semi-polar plane.

In the group III nitride semiconductor light emitting device according to the present invention, the p-type cladding layer contains a carbon impurity and the carbon concentration can be $4\times10^{16}$ cm$^{-3}$ or less.

According to the group III nitride semiconductor light emitting device, when carbon functions as an electron donor, the carbon concentration of not more than $6 \times 10^{17}$ cm$^{-3}$ suppresses carrier compensation in the p-type cladding layer, so that carriers from the activated acceptors providing electrical conduction. In the p-type cladding layer, the carbon concentration of not more than $6 \times 10^{17}$ cm$^{-3}$ advantageously permit an energy difference (E(BAND)−E(DAP)) of 0.42 electron volts or less.

The group III nitride semiconductor light emitting device according to the present invention can further include a monitor semiconductor layer in contact with the p-type cladding layer. Preferably the material of the monitor semiconductor layer is the same as that of the p-type cladding layer, the p-type dopant concentration of the monitor semiconductor layer is smaller than that of the p-type cladding layer, and the thickness of the monitor semiconductor layer is lower than that of the p-type cladding layer.

According to the group III nitride semiconductor light emitting device, in the photoluminescence spectrum, not only the donor-acceptor pair emission but also the band-edge emission are used. In the group III nitride semiconductor, the band-edge emission decreases as the acceptor concentration increases. Meanwhile, the p-type cladding layer is doped with a p-type dopant in such a concentration as required for achieving the target properties. It is effective to use the monitor semiconductor layer formed in contact with the p-type cladding layer in order to achieve the band-edge emission of high signal strength in the photoluminescence spectrum. The p-type dopant concentration and the thickness of the monitor semiconductor layer can be independent from those of the p-type cladding layer. The p-type dopant concentration of the monitor semiconductor layer thus can be reduced relative to that in the p-type cladding layer, and the thickness of the monitor semiconductor layer can also be reduced compared to that of the p-type cladding layer.

In the group III nitride semiconductor light emitting device according to the present invention, the thickness of the monitor semiconductor layer is preferably in the range of 5 nm to 40 nm.

According to the group III nitride semiconductor light emitting device, when a thickness of the monitor semiconductor layer is less than 5 nm, the monitor semiconductor layer cannot absorb enough energy of the excitation light to create the band-edge emission with sufficient strength. When a thickness of the monitor semiconductor layer is more than 40 nm, the addition of the monitor semiconductor layer with a low p-type dopant concentration increases the resistance, possibly resulting in inferior voltage characteristics of the emission device.

In the group III nitride semiconductor light emitting device according to the present invention, the p-type dopant concentration of the monitor semiconductor layer is preferably in the range of not less than $1 \times 10^{17}$ cm$^{-3}$ to less than $1 \times 10^{18}$ cm$^{-3}$. According to the group III nitride semiconductor light emitting device, preferably the monitor semiconductor layer has a p-type dopant concentration in the order of $10^{17}$ cm-3.

In the group III nitride semiconductor light emitting device according to the present invention, preferably the p-type cladding layer contains hydrogen and has a hydrogen concentration of not more than $4 \times 10^{18}$ cm$^{-3}$. According to the group III nitride semiconductor light emitting device, hydrogen is combined with the p-type dopant to inhibit the activation of the p-type dopant. A reduction in the hydrogen concentration of the p-type cladding layer increases the carrier concentration of the p-type cladding layer without formation of a deep level of the p-type dopant.

The method of fabricating the group III nitride semiconductor light emitting device according to the present invention includes the steps of: (a) growing an n-type group III nitride semiconductor layer for an n-type cladding layer, a group III nitride semiconductor layer for an active layer, and a p-type group III nitride semiconductor layer for a p-type cladding layer on a substrate to form an epitaxial substrate for the group III nitride semiconductor light emitting device; (b) irradiating the p-type group III nitride semiconductor layer with excitation light to measure a photoluminescence spectrum containing a band-edge emission of the p-type group III nitride semiconductor layer and a donor-acceptor pair emission of the p-type cladding layer; (c) creating a difference (E(BAND)−E(DAP)) between an energy E(BAND) of a band-edge emission peak value in the photoluminescence spectrum and an energy E(DAP) of a donor-acceptor pair emission peak value in the photoluminescence spectrum; (d) determining, using the difference (E(BAND)−E(DAP)), whether or not to apply a following step to the epitaxial substrate; (e) applying a process for forming an electrode to the epitaxial substrate if the determination is affirmative, a wavelength of the excitation light being shorter than a band-gap wavelength of the p-type group III nitride semiconductor layer of the p-type cladding layer.

According to the fabrication method, the photoluminescence spectrum containing a band-edge emission and a donor-acceptor pair emission is measured by irradiating the p-type group III nitride semiconductor layer with excitation light after the step of growing the epitaxial substrate E before the subsequent step. The energy E(BAND) of the band-edge emission peak value and the energy E(DAP) of the donor-acceptor pair emission peak value in this measurement are used to obtain the difference (E(BAND)−E(DAP)), and determination of application of the following step to the epitaxial substrate is made using the above difference. The difference (E(BAND)−E(DAP)) has a correlation with voltage characteristics of the group III nitride semiconductor light emitting device. The group III nitride semiconductor light emitting device fabricated using these steps does not exhibit voltage characteristics attributed to high resistance of the p-type cladding layer.

In the method of fabricating the group III nitride semiconductor light emitting device according to the present invention, the difference (E(BAND)−E(DAP)) is preferably not more than 0.42 electron volts. The fabrication method can provide a group III nitride semiconductor light emitting device exhibiting more excellent voltage characteristics.

In the method of fabricating the group III nitride semiconductor light emitting device according to the present invention, the photoluminescence spectrum is preferably measured at a temperature of not more than 100 degrees Kelvin. According to the fabrication method, the photoluminescence spectrum can contain distinct peaks assigned to a band-edge emission and a donor-acceptor pair emission.

The method of fabricating the group III nitride semiconductor light emitting device according to the present invention can include, for the growth of the p-type cladding layer in the subsequent fabricating process of the epitaxial substrate, the step of reconsidering the film-forming conditions on a basis of the difference (E(BAND)−E(DAP)).

According to the fabrication method, the film-forming recipe(s) reconditioned by the reconsideration can be fed back to the fabrication step on a basis of the observed photoluminescence spectrum of the epitaxial substrate without delaying to wait for the evaluation of the group III nitride semiconductor light emitting device obtained after the formation of the electrode. This fabrication method provides prompt process control.

In the method of fabricating the group III nitride semiconductor light emitting device according to the present invention, the step of forming the epitaxial substrate can further include a step of growing another p-type group III nitride semiconductor layer on the substrate for a p-type contact layer. Preferably the other p-type group III nitride semiconductor layer is located between the p-type group III nitride semiconductor layer for the p-type clad layer and the group III nitride semiconductor layer for the active layer, the p-type dopant concentration of the p-type contact layer is greater than that of the p-type cladding layer, the band gap of the p-type contact layer is smaller than that of the p-type cladding layer, the thickness of the p-type contact layer is 0.06 micrometers or less, and the p-type dopant concentration of the p-type contact layer is $1 \times 10^{19}$ cm$^{-3}$ or more.

According to the fabrication method, in order to evaluate the voltage characteristics of the group III nitride semiconductor for the p-type cladding layer at high accuracy, preferably the proportion of the cladding component contained in the photoluminescence spectrum (the signal component derived from excitation in the cladding layer) is 90% or more. When a thickness of the p-type contact layer is 0.06 micrometers or less, the contact component from the p-type contact layer does not have a large proportion relative to the cladding component, thus effectively reducing the proportion of the contact component contained in the photoluminescence spectrum to about 10% or less. Furthermore, at a p-type dopant concentration of the p-type contact layer of $1 \times 10^{19}$ cm$^{-3}$ or more, the contact component from the p-type contact layer does not have a large proportion relative to the cladding component, thus effectively reducing the proportion of the contact component contained in the photoluminescence spectrum to about 10% or less.

In the method of fabricating the group III nitride semiconductor light emitting device according to the present invention, the p-type contact layer preferably is composed of p-type GaN.

According to the fabrication method, the contact layer of p-type GaN is suitable for measurement of a photoluminescence spectrum which can contain distinct peaks assigned to a band-edge emission and a donor-acceptor pair emission.

BRIEF DESCRIPTION OF THE DRAWINGS

The above-described object and other objects, features and advantages of the present invention will be apparent from the detailed description of the embodiments of the present invention with reference to the accompanying drawings.

FIG. 2 is a drawing showing a photoluminescence spectrum and its correlation relationship;

FIG. 5 is a drawing schematically illustrating steps in the method of fabricating the group III nitride semiconductor laser device in accordance with an embodiment of the present invention;

FIG. 6 is a drawing schematically illustrating steps in the method of fabricating the group III nitride semiconductor laser device in accordance with an embodiment of the present invention;

FIG. 8 is a drawing schematically illustrating examples of a group III nitride semiconductor laser device in accordance with an embodiment of the present invention;

FIG. 11 is a drawing illustrating an averaged photoluminescence spectrum.

DESCRIPTION OF THE PREFERRED EMBODIMENTS

The expertise of the present invention can be readily understood in view of the following detailed description with reference to the accompanying drawings provided by way of illustration only. In reference to the accompanying drawings, the embodiments of a group III nitride semiconductor light emitting device and an epitaxial substrate, and the method of fabricating an epitaxial substrate and the method of fabricating a group III nitride semiconductor light emitting device will be described below. The same portions will be denoted by the same reference symbols, if possible.

Figure 1:
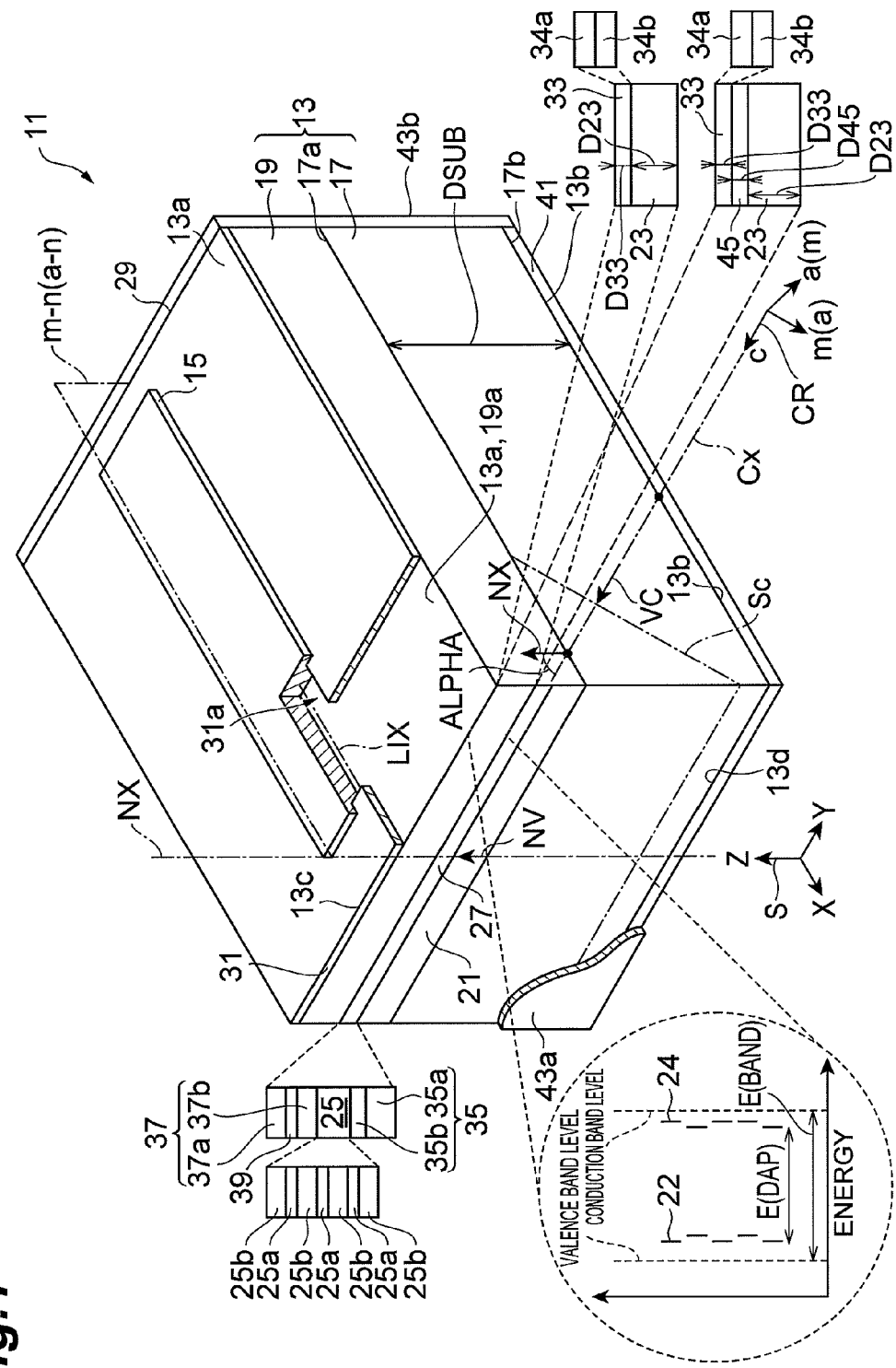
FIG. 1 is a schematic view illustrating the structure of a group III nitride semiconductor light emitting device in accordance with an embodiment of the present invention.

FIG. 1 is a schematic view illustrating the structure of a group III nitride semiconductor light emitting device in accordance with an embodiment of the present invention. In the embodiment of the present invention, a group III nitride semiconductor laser device 11 will be explained as the group III nitride semiconductor light emitting device. The group III nitride semiconductor laser device 11 has a gain-guided structure, but embodiments of the present invention are not limited to the gain-guided structure. The group III nitride semiconductor laser device 11 includes an anode electrode 15, a substrate 17, a semiconductor region 19, and a cathode electrode 41. The substrate 17 and the semiconductor region 19 form a laser structure 13. The substrate 17 has a semi-polar primary surface 17a and back surface 17b. The semiconductor region 19 is provided on the primary surface 17a of the substrate 17. The anode electrode 15 is provided on the semiconductor region 19 of the laser structure 13. The cathode electrode 41 is electrically coupled to an n-type cladding layer 21. The semiconductor region 19 includes the n-type cladding layer 21, p-type cladding layer 23 and active layer 25, and the n-type cladding layer 21, active layer 25, and p-type cladding layer 23 are provided on the primary surface 17a of the substrate 17. The n-type cladding layer 21 comprises an n-type group III nitride semiconductor. The n-type group III nitride semiconductor contains indium and aluminum as group III elements, and is composed of, for example, n-type InAlGaN. The p-type cladding layer 23 comprises a p-type group III nitride semiconductor. The p-type group III nitride semiconductor contains indium and aluminum as group III elements, and is composed of, for example, p-type InAlGaN. The active layer 25 is provided between the n-type cladding layer 21 and the p-type cladding layer 23. The n-type cladding layer 21, the active layer 25 and the p-type cladding layer 23 are arranged in the direction of the normal axis NX (the direction of normal vector NV) of the primary surface 17a of the substrate 17. The p-type cladding layer 23 is doped with a p-type dopant 22 which provides a level 22 of acceptor. This level 22 of the acceptors are distributed mostly in a certain energy range. The p-type cladding layer 23 includes an n-type impurity 24 which provides levels 24 of donor. The levels 24 of donor are distributed mostly within a certain energy range. The concentration of the p-type dopant 22 is greater than the concentration of the n-type impurity 24. The c-axis (the axis extending in the direction of the vector VC) of the n-type group III nitride semiconductor of the n-type cladding layer 21 tilts with respect to the normal axis NX, and the c-axis of the p-type group III nitride semiconductor of the p-type cladding layer 23 tilts with respect to the normal axis NX.

In the group III nitride semiconductor laser device 11, the difference (E(BAND)–E(DAP)) between the energy E(BAND) of a band-edge emission peak value in a photoluminescence spectrum of the p-type cladding layer 23 and the energy E(DAP) of a donor-acceptor pair emission peak value in the photoluminescence spectrum (referred to as "PL spectrum) is not more than 0.42 electron volts, where the energy E(BAND) of the band-edge emission and the energy E(DAP) of a donor-acceptor pair emission are expressed in units of electron volts.

The primary surface 17a of the substrate 17 is composed of a group III nitride, and the c-axis of the group III nitride of the substrate 17 tilts with respect to the normal axis NX of the primary surface 17a of the substrate 17. The substrate 17 can comprise a hexagonal group III nitride semiconductor. Furthermore, the group III nitride semiconductor laser device 11 can provide the lamination made of the semiconductor layers arranged along the normal axis NX of the so-called semi-polar primary surface 17a.

In the group III nitride semiconductor laser device 11, the n-type cladding layer 21, the active layer 25 and the p-type cladding layer 23 are arranged along the normal axis of the primary surface 17a of the substrate 17; the c-axis of the n-type group III nitride semiconductor of the n-type cladding layer 21 and the c-axis of the p-type group III nitride semiconductor of the p-type cladding layer 23 both are inclined with respect to the normal axis; and the active layer 35 is provided between the n-type cladding layer 21 and the p-type cladding layer 23. In the group III nitride semiconductor light emitting device 11, the p-type cladding layer 23 contains a p-type dopant and an n-type impurity such that the concentration of the p-type dopant is greater than that of the n-type impurity in the p-type cladding layer 23. Thus, as illustrated in Part (a) of FIG. 2, the photoluminescence spectrum, which is measured with excitation light having a higher energy than the band gap of the p-type cladding layer 23, includes peaks of a band-edge emission and a donor-acceptor pair emission. The studies by the present inventors demonstrate that the difference (E(BAND)–E(DAP)) between the energy E(BAND) of a band-edge emission peak value in the PL spectrum and the energy E(DAP) of a donor-acceptor pair emission peak value in the PL spectrum has a correlation with the forward driving voltage (Vf) of the group III nitride semiconductor laser device 11 as illustrated in FIG. 2(b). At an energy difference (E(BAND)–E(DAP)) of not more than 0.42 electron volts, the driving voltage in the forward voltage application can be reduced as compared to a conventional group III nitride semiconductor light emitting device. The forward driving voltage (Vf) in Part (b) of FIG. 2 indicates a driving voltage between the terminals of the laser diode in application of a current of 100 milliamps to the laser diode.

The band-edge emission corresponds to the band gap of the p-type group III nitride semiconductor of the p-type cladding layer 23. Since the donor-acceptor pair emission is generated via a complicated process involving interaction of photons with phonons, the PL spectrum itself has a complex shape. For this reasons, in order to obtain the peak value of donor-acceptor pair emission from the PL spectrum, it is preferable that processing of data for the spectral shape (e.g. smoothing processing) be performed. Since the tail of the spectrum associated with the donor-acceptor pair emission overlaps with that of the band-edge emission, it is preferable that processing of data for the spectral shape (e.g. averaging process) be performed to identify the exact position of the spectrum peak.

Referring back to FIG. 1, the active layer 25 includes gallium nitride-based semiconductor layers, and the gallium nitride-based semiconductor layers are, for example, well layers 25a. The active layer 25 includes several barrier layers 25b comprising a gallium nitride-based semiconductor. The well layer 25a is provided between the barrier layers 25b, and thus they are alternately arranged. The well layer 25a is composed of, for example, InGaN, and the barrier layers 25b are composed of, for example, GaN or InGaN. The active layer 25 can comprise a quantum well structure to generate light with a wavelength of 360 nm to 600 nm. The wavelength of the light emission spectrum is preferably in the range of 500 nm to 580 nm due to the use of the semi-polar plane. The n-type cladding layer 21, the p-type cladding layer 23, and the active layer 25 are aligned along the normal axis NX of the primary surface 17a. In the group III nitride semiconductor laser device 11, the laser structure 13 includes a first end face 27 and a second end face 29, which intersect an m-n plane defined by the m-axis of the hexagonal group III nitride semiconductor and the normal axis NX.

FIG. 1 depicts an orthogonal coordinate system S and a crystallite coordinate system CR. The normal axis NX is directed to the direction of the Z-axis of the orthogonal coordinate system S. The primary surface 17a extends parallel to a predetermined plane defined by the X-axis and the Y-axis of the orthogonal coordinate system S. FIG. 1 also depicts a typical c-plane Sc. The c-axis of the hexagonal group III nitride semiconductor of the substrate 17 is inclined at an angle ALPHA of more than zero apart from the normal axis NX in the direction of m-axis of the hexagonal group III nitride semiconductor.

The group III nitride semiconductor laser device 11 further includes an insulating layer 31. The insulating layer 31 covers a surface 19a of the semiconductor region 19 of the laser structure 13, and the semiconductor region 19 is located between the insulating layer 31 and the substrate 17. The substrate 17 comprises a hexagonal group III nitride semiconductor. The insulating layer 31 has an opening 31a which extends along an intersecting line LIX between the surface 19a of the semiconductor region 19 and the m-n plane to have, for example, a stripe shape. The anode electrode 15 is in contact with the surface 19a of the semiconductor region 19 (e.g. p-type contact layer 33) through the opening 31a, and extends in the direction of the intersecting line LIX. In the group III nitride semiconductor laser device 11, a laser waveguide includes the n-type cladding layer 21, the p-type cladding layer 23 and the active layer 25, and extends in the direction of the intersecting line LIX.

The substrate 17 has a thickness allowing its free-standing. The substrate 17 is composed of any one of GaN, AlN, AlGaN, InGaN, and InAlGaN. The substrate comprises any one of these gallium nitride-based semiconductor can provide the end faces 27, 29 which can be used as an optical cavity. Furthermore, in the group III nitride semiconductor laser device 11, a first fractured face 27 and a second fractured face 29 intersect with the m-n plane defined by the m-axis of the hexagonal group III nitride semiconductor and the normal axis NX. A laser cavity of the group III nitride semiconductor laser device 11 includes the first and second fractured faces 27, 29, and the laser waveguide extends from one of the first and second fractured faces 27, 29 to the other. The laser structure 13 includes a first surface 13a and a second surface 13b, and the first surface 13a is opposite to the second surface 13b. The first and second fractured faces 27, 29 extend from an edge 13c of the first surface 13a to an edge 13d of the second surface 13b. The first and second fractured faces 27, 29 are different from conventional cleaved facets such as c-planes, m-planes, or a-planes.

According to this group III nitride semiconductor laser device 11, the first and second fractured faces 27, 29 that form a laser cavity intersect with the m-n plane. This structure can provide a laser waveguide extending in the direction of the intersection of the m-n plane with the semi-polar plane 17a. Accordingly, the group III nitride semiconductor laser device 11 has the laser cavity enabling a low threshold current.

The group III nitride semiconductor laser device 11 includes an n-side optical guide layer 35 and a p-side optical guide layer 37. The n-side optical guide layer 35 includes a first portion 35a and a second portion 35b, and the n-side optical guide layer 35 is composed of, for example, GaN or InGaN. The p-side optical guide layer 37 includes a first portion 37a and a second portion 37b, while the p-side optical guide layer 37 is composed of, for example, GaN or InGaN. A carrier block layer 39 is provided, for example, between the first portion 37a and the second portion 37b. Another electrode 41 is provided on the back surface 17b of substrate 17, and the electrode 41 covers, for example, the back surface 17b of the substrate 17.

In the group III nitride semiconductor laser device 11, the angle ALPHA defined by the normal axis NX and the c-axis of the hexagonal group III nitride semiconductor is preferably not less than 10 degrees and preferably not more than 80 degrees. Furthermore, the angle ALPHA is preferably not less than 100 degrees and preferably not more than 170 degrees. At an angle of less than 10 degrees, the incorporation of indium becomes non-uniform, causing poor crystallinity of the cladding layer which results in a reduction in the PL intensity of the cladding layer to 90% or less of that of the contact layer. The band-edge emission thereof is also weakened, leading to difficulty in identification of the wavelength of the band-edge emission, which results in difficulty in creation of an index of the voltage characteristics, i.e., (E(BAND)–E(DAP)). At an angle of more than 80 degrees and less than 100 degrees, the incorporation of indium becomes non-uniform, causing poor crystallinity of the cladding layer which results in a reduction in the PL intensity of the cladding layer to 90% or less of that of the contact layer. The band-edge emission thereof is also weakened, leading to the difficulty in identification of the wavelength of the band-edge emission, which results in the difficulty in creation of an index of the voltage characteristics, i.e., (E(BAND)–E(DAP)). At an angle of more than 170 degrees, the incorporation of indium becomes non-uniform, causing poor crystallinity of the cladding layer which results in a reduction in the PL intensity of the cladding layer to 90% or less of that of the contact layer. The band-edge emission is also weakened, leading to difficulty in identification of the wavelength of the band-edge emission, which results in difficulty in generation of an index of the voltage characteristics, i.e., (E(BAND)–E(DAP)).

Furthermore, in the group III nitride semiconductor laser device 11, the angle ALPHA formed between the normal axis NX and the c-axis of the hexagonal group III nitride semiconductor is preferably not less than 63 degrees and preferably not more than 80 degrees. Furthermore, the angle ALPHA is preferably not less than 100 degrees and preferably not more than 117 degrees. At an angle of less than 63 degrees, the incorporation of indium becomes non-uniform, causing poor crystallinity of the cladding layer which results in a reduction in the PL intensity of the cladding layer to 90% or less of that of the contact layer. The band-edge emission is also weakened, leading to difficulty in identification of the wavelength of the band-edge emission, which results in difficulty in creation of an index of the voltage characteristics, i.e., (E(BAND)–E(DAP)). At an angle of more than 80 degrees and less than 100 degrees, the incorporation of indium becomes non-uniform, causing poor crystallinity of the cladding layer which results in a reduction in the PL intensity of the cladding layer to 90% or less of that of the contact layer. The band-edge emission is also weakened, leading to difficulty in identification of the wavelength of the band-edge emission, which results in difficulty in creation of an index of the voltage characteristics, (E(BAND)–E(DAP)). At an angle of more than 117 degrees, the incorporation of indium becomes non-uniform, causing poor crystallinity of the cladding layer which results in a reduction in the PL intensity of the cladding layer to not 90% or less of that of the contact layer. The band-edge emission is also weakened, leading to difficulty in identification of the wavelength of the band-edge emission, which results in difficulty in creation of (E(BAND)–E(DAP)), which is an index of the voltage characteristics. Accordingly, the angle ALPHA is preferably in the range of 63 degrees to 80 degrees or in the range of 100 degrees to 117 degrees.

The first and second end faces 27, 29 for the laser cavity are different from conventional cleaved facets such as c-planes, m-planes, or a-planes. The first and second end faces 27, 29, however, have flatness and perpendicularity as mirrors for a cavity. For this reason, the first and second end faces 27, 29 each are sometimes referred to as a "fractured face" to distinguish from a "cleaved facet." The use of the first and second end faces 27, 29 and the laser waveguide extending between the end faces 27, 29 can achieve low threshold lasing. The group III nitride semiconductor laser device 11 further includes dielectric multilayer films 43a, 43b provided on the first and second end faces 27, 29. End face coating films can be provided to the end faces 27, 29 for adjustment of reflectance.

In the measurement of PL spectrum, when a thickness D23 of the p-type cladding layer 23 is 0.18 μm or more, the p-type cladding layer 23 can generate sufficiently stronger spectra than signal components from other p-types of semiconductor layers. Preferably the p-type cladding layer 23 includes an InAlGaN layer and the InAlGaN layer has preferably a thickness of 180 nm or more. In order to evaluate the voltage characteristics of a quaternary InAlGaN for the p-type cladding layer 23 at high accuracy, the proportion of the cladding component contained in the photoluminescence spectrum (signal component derived from excitation in the cladding layer) is preferably 90% or more. This proportion is defined by the expression: (DAP integrated emission intensity of contact component in PL spectrum)/(overall DAP integrated emission intensity)<0.1.

The n-type cladding layer 21 preferably includes an InAlGaN layer. When the n-type cladding layer 21 includes the InAlGaN layer, the layer 21 can provide good optical confinement.

Figure 3:
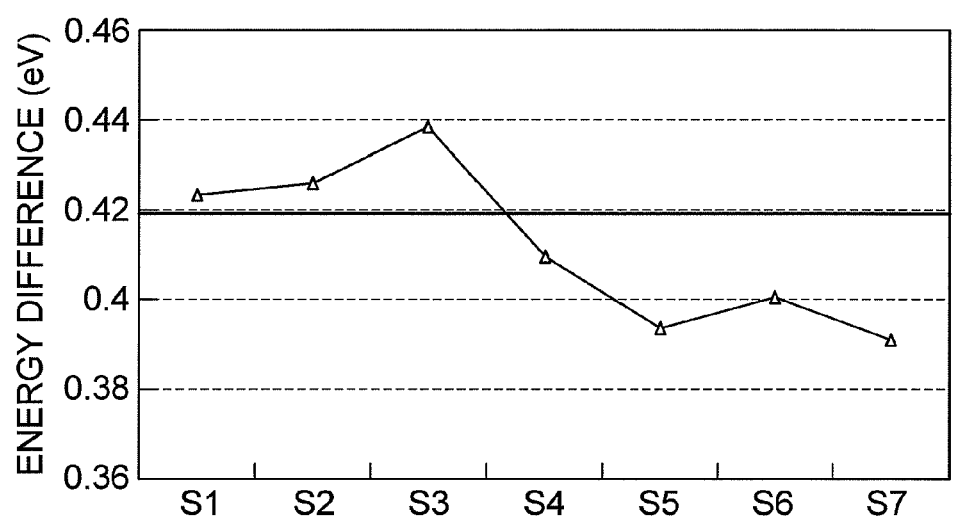
FIG. 3 is a drawing showing the tendency of the difference (E(BAND)−E(DAP))

FIG. 3 illustrates the energy difference (E(BAND)–E(DAP)) in photoluminescence spectra of several group III nitride semiconductor laser devices. The energy differences (E(BAND)–E(DAP)) in the group III nitride semiconductor laser devices S1 to S7 are plotted. The inventors measured the concentrations of several elements (Mg, Si, and C) contained in the p-type cladding layer through secondary ion mass spectrometry.

Group III nitride semiconductor laser device S1
    Magnesium concentration: $1 \times 10^{18}$ cm$^{-3}$,
    Oxygen concentration: $6 \times 10^{17}$ cm$^{-3}$,
    Carbon concentration: $7 \times 10^{16}$ cm$^{-3}$.

Group III nitride semiconductor laser device S2
    Magnesium concentration: $2 \times 10^{18}$ cm$^{-3}$,
    Oxygen concentration: $7 \times 10^{17}$ cm$^{-3}$,
    Carbon concentration: $6 \times 10^{16}$ cm$^{-3}$.

Group III nitride semiconductor laser device S3
    Magnesium concentration: $1 \times 10^{18}$ cm$^{-3}$,
    Oxygen concentration: $9 \times 10^{17}$ cm$^{-3}$,
    Carbon concentration: $8 \times 10^{16}$ cm$^{-3}$.

Group III nitride semiconductor laser device S4
    Magnesium concentration: $6 \times 10^{18}$ cm$^{-3}$,
    Oxygen concentration: $6 \times 10^{17}$ cm$^{-3}$,
    Carbon concentration: $4 \times 10^{16}$ cm$^{-3}$.

Group III nitride semiconductor laser device S5
    Magnesium concentration: $1 \times 10^{19}$ cm$^{-3}$,
    Oxygen concentration: $1 \times 10^{17}$ cm$^{-3}$,
    Carbon concentration: $1 \times 10^{16}$ cm$^{-3}$.

Group III nitride semiconductor laser device S6
    Magnesium concentration: $8 \times 10^{18}$ cm$^{-3}$,
    Oxygen concentration: $2 \times 10^{17}$ cm$^{-3}$,
    Carbon concentration: $3 \times 10^{16}$ cm$^{-3}$.

Group III nitride semiconductor laser device S7
    Magnesium concentration: $1 \times 10^{19}$ cm$^{-3}$,
    Oxygen concentration: $8 \times 10^{16}$ cm$^{-3}$,
    Carbon concentration: $3 \times 10^{16}$ cm$^{-3}$.

The relationship between the concentrations of these elements and the energy differences (E(BAND)–E(DAP)) are explained based on the experimental results. The group III nitride semiconductor laser devices S4 to S7 are prepared through amelioration experiments by the present inventors, while the group III nitride semiconductor laser devices S1 to S3 have been prepared before these experiments. The aim of the amelioration experiments is to achieve film growth which enables, for example, an increase in the Mg concentration, a reduction in the oxygen concentration, and a reduction in the concentration. In consideration of the results of other experiments not cited here along with the above, the devices can be classified into two groups at an energy difference (E(BAND)–E(DAP)) of 0.42 electron volt (eV).

According to the studies conducted by the present inventors, the group III nitride semiconductor laser devices S1 to S7 can be also classified into one group (the group III nitride semiconductor laser devices S1 to S3) and the other group (the group III nitride semiconductor laser devices S4 to S7) in terms of the element concentrations.

The range of the concentrations of elements in the group III nitride semiconductor laser devices S1 to S3 is as follows:
    Mg concentration: less than $3 \times 10^{18}$ cm$^{-3}$;
    O concentration: greater than $6 \times 10^{17}$ cm$^{-3}$; and
    C concentration: greater than $4 \times 10^{16}$ cm$^{-3}$.

The range of the concentrations of elements in the group III nitride semiconductor laser devices S4 to S7 is as follows:
    Mg concentration: not less than $3 \times 10^{18}$ cm$^{-3}$ and not more than $1 \times 10^{20}$ cm$^{-3}$.
    O concentration: not less than $6 \times 10^{16}$ cm$^{-3}$ and not more than $6 \times 10^{17}$ cm$^{-3}$; and
    C concentration: not less than $4 \times 10^{15}$ cm$^{-3}$ and not more than $4 \times 10^{16}$ cm$^{-3}$.

According to the investigation based on the data of these and additional experiments, the hydrogen concentration in the p-type cladding layer 23 is preferably not more than $4 \times 10^{18}$ cm$^{-3}$. This upper limit is determined in order to prevent degradation of the voltage characteristics due to inactivation of magnesium caused by formation of a Mg—H complex.

According to these studies, when the upper limit of the energy difference (E(BAND)–E(DAP)) is 0.42 eV or less, the group III nitride semiconductor laser device can have a reduced forward voltage. The energy difference (E(BAND)–E(DAP)) is, for example, preferably 0.3 eV or more. The lower limit is empirically determined from the fact that the position of the DAP emission peak shifts to longer wavelengths (lower energy side) as the Mg concentration increases. A mere reduction in Mg concentration in an attempt to reduce the energy difference (E(BAND)–E(DAP)) to 0.3 eV or less (shift of the DAP emission wavelength to shorter wavelengths) leads to inferior voltage characteristics at the same time due to the reduced Mg concentration, failing to achieve 0.3 eV or less. The value of 0.3 eV is based on the criteria such as a threshold.

The p-type dopant of the p-type cladding layer 23 includes magnesium and the carrier providing electrical conduction in the p-type cladding layer 23 is holes. A magnesium concentration is $3 \times 10^{18}$ cm$^{-3}$ or more can provide a carrier concentration for the electrical conduction in such a level that satisfactory voltage characteristics of the group III nitride semiconductor laser device 11 are maintained.

The n-type impurity in the p-type cladding layer 23 includes oxygen, and the oxygen impurities function as donor to provide electrons while the carrier providing electrical conduction in the p-type cladding layer 23 is holes. An oxygen concentration of $6 \times 10^{17}$ cm$^{-3}$ or less can prevent carrier compensation in the p-type cladding layer 23, so that carriers from activated acceptors take the role of electrical conduction. An oxygen concentration of $6 \times 10^{17}$ cm$^{-3}$ or less can advantageously yield an energy difference (E(BAND)–E(DAP)) of 0.42 electron volts or less.

The p-type cladding layer 23 contains a carbon impurity that functions as donor providing electron. A carbon concentration of not more than $6 \times 10^{17}$ cm$^{-3}$ suppresses carrier compensation in the p-type cladding layer, so that carriers from the activated acceptors take the role of electrical conduction. In the p-type cladding layer 23, a carbon concentration of not more than $6 \times 10^{17}$ cm$^{-3}$ can advantageously yield an energy difference (E(BAND)–E(DAP)) of 0.42 electron volts or less.

The p-type cladding layer 23 contains hydrogen, which combines with magnesium of a p-type dopant to inhibit the activation of the p-type dopant. The p-type cladding layer 23 preferably has a hydrogen concentration of not more than $4 \times 10^{18}$ cm$^{-3}$. A reduction in the hydrogen concentration of the p-type cladding layer 23 increases the carrier concentration of the p-type cladding layer 23 without formation of a deep level of the p-type dopant.

With reference to FIG. 1, the group III nitride semiconductor laser device 11 can further include a p-type contact layer 33 provided over the p-type cladding layer 23. The band gap of the p-type group III nitride semiconductor of the p-type contact layer 33 is smaller than that in the p-type cladding layer 23. Preferably the p-type dopant concentration in the p-type contact layer 33 is greater than that in the p-type cladding layer 23.

The thickness D33 of the p-type contact layer 33 is preferably, for example, 0.06 micrometers or less. In order to evaluate the voltage characteristics of the group III nitride semiconductor for the p-type cladding layer 23 at high accuracy, preferably the proportion of the cladding component contained in the photoluminescence spectrum (signal component from excitation in the cladding layer) is 90% or more. At a thickness of the p-type contact layer 33 of 0.06 micrometers or less, the contact component from the p-type contact layer 33 does not occupy a large proportion relative to the cladding component, thus effectively reducing the proportion of the contact component contained in the photoluminescence spectrum to about 10% or less.

The p-type contact layer 33 includes a p-type group III nitride semiconductor. The p-type contact layer 33 may be composed of, for example, p-type GaN, and the p-type dopant concentration in the p-type contact layer 33 is preferably $1 \times 10^{19}$ cm$^{-3}$ or more. At a p-type dopant concentration in the p-type GaN of $1 \times 10^{19}$ cm$^{-3}$ or more, the contact component from the p-type contact layer 33 does not occupy a large proportion relative to the cladding component, thus effectively reducing the proportion of the contact component contained in the photoluminescence spectrum to about 10% or less.

As illustrated in FIG. 1, the p-type contact layer 33, which is not limited to a single layer, can include plural group III nitride semiconductor layers having different p-type dopant concentrations. The p-type contact layer 33 includes, for example, a p-type first group III nitride semiconductor layer 34a and a p-type second group III nitride semiconductor layer 34b. The second group III nitride semiconductor layer 34b is provided between the first group III nitride semiconductor layer 34a and the p-type cladding layer 23. The p-type dopant concentration of the first group III nitride semiconductor layer 34a is preferably greater than that of the second group III nitride semiconductor layer 34b. The p-type dopant concentration of the p-type cladding layer 23 is preferably smaller than that of the second group III nitride semiconductor layer 34b. The anode electrode 15 is in contact with the first group III nitride semiconductor layer 34a.

The group III nitride semiconductor laser device 11 can further include a semiconductor layer 45 in contact with the p-type cladding layer 23 as illustrated in FIG. 1. The material of the semiconductor layer 45 is the same as that of the p-type cladding layer 23, so that the band gap of the semiconductor layer 45 is the same as that of the p-type cladding layer 23. The p-type dopant concentration of the semiconductor layer 45 is smaller than that of the p-type cladding layer 23. The thickness D45 of the semiconductor layer 45 is preferably lower than the thickness D23 of the p-type cladding layer 23. Accordingly, the semiconductor layer 45 can be used as a monitor semiconductor layer to achieve a distinct band-edge emission.

As described above, the photoluminescence spectrum uses not only the donor-acceptor pair emission but also the band-edge emission. According to the inventors' findings, in the group III nitride semiconductor, the band-edge emission decreases as the acceptor concentration increases. Meanwhile, the p-type cladding layer 23 is doped with a p-type dopant in such a concentration as required for achieving the target properties. The semiconductor layer 45 in contact with the p-type cladding layer 23 achieves band-edge emission with high signal strength in the photoluminescence spectrum. The p-type dopant concentration and the thickness of the semiconductor layer 45 may be independent from those of the p-type cladding layer 23. Thus, the p-type dopant concentration in the semiconductor layer 45 can be reduced relative to that in the p-type cladding layer 23, and the thickness D45 of the semiconductor layer 45 can also be reduced compared to the thickness D23 of the p-type cladding layer 23.

The thickness D45 of the semiconductor layer 45 is preferably 40 nm or less. At a thickness D45 of the semiconductor layer 45 of more than 40 nm, the addition of the semiconductor layer 45 at a low p-type dopant concentration increases the resistance, possibly resulting in inferior voltage characteristics of the emission device. The thickness D45 of the semiconductor layer 45 is preferably 5 nm or more. At a thickness of the semiconductor layer 45 of less than 5 nm, the semiconductor layer 45 cannot absorb enough energy of the excitation light to generate the band-edge emission with sufficient strength. The preferred thickness of the semiconductor layer 45 is hence in the range of 5 nm to 40 nm.

The p-type dopant concentration of the semiconductor layer 45 is preferably in the range of $1 \times 10^{17}$ cm$^{-3}$ to less than $1 \times 10^{18}$ cm$^{-3}$. The semiconductor layer 45 preferably has a p-type dopant concentration in the order of $10^{17}$ cm$^{-3}$ to achieve a distinct band-edge emission.

Figure 4:
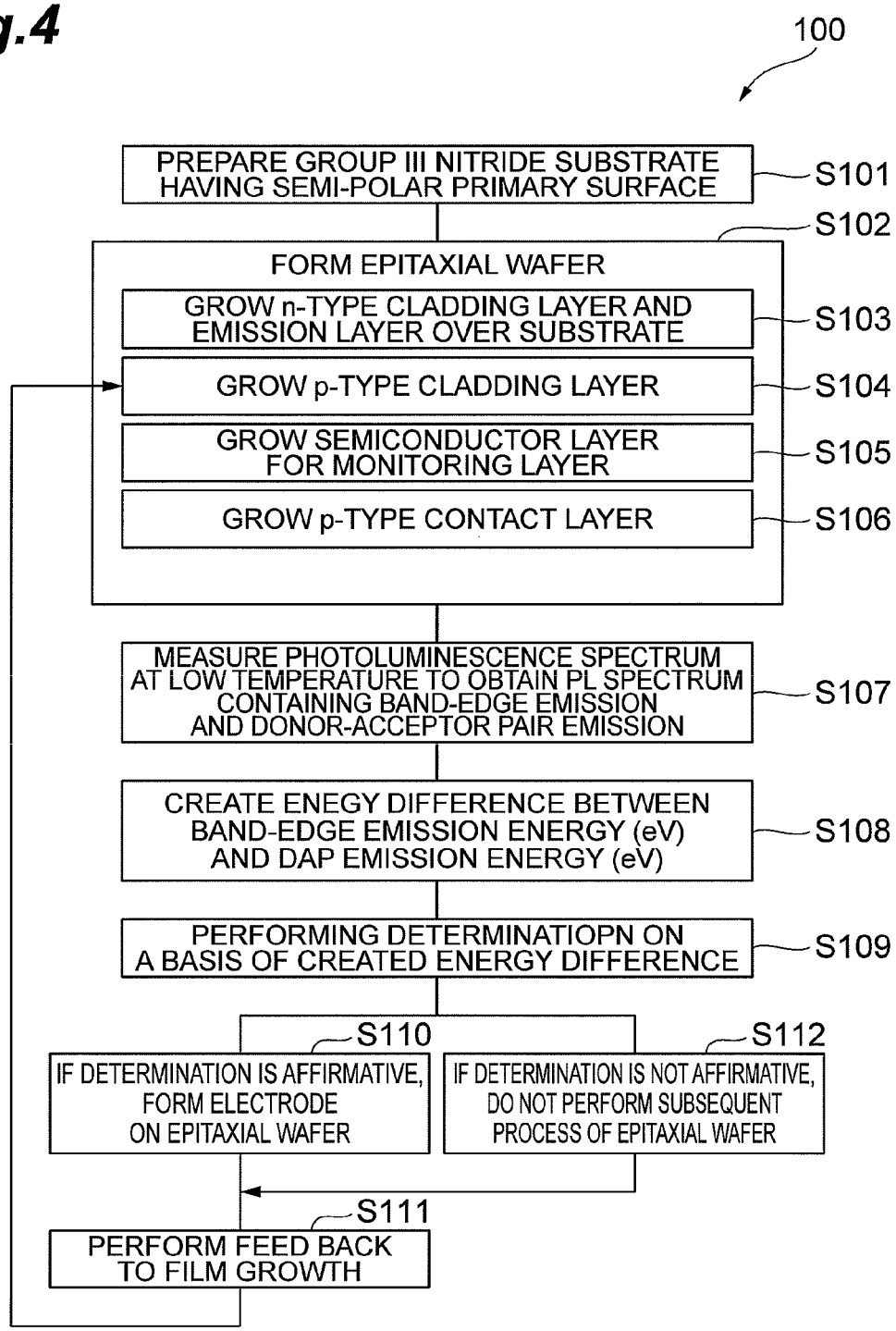
FIG. 4 is a flow chart illustrating major steps in the method of fabricating a group III nitride semiconductor laser device in accordance with an embodiment of the present invention.

FIG. 4 is a flow chart illustrating major steps in a method of fabricating a group III nitride semiconductor laser device in accordance with an embodiment of the present invention. In Step S101, a substrate is prepared for fabricating the group III nitride semiconductor laser device (the substrate is referred to as a reference number "51" in Part (a) of FIG. 5). The c-axis (vector VC in FIG. 1) of the hexagonal group III nitride semiconductor of the substrate 51 is inclined at a finite angle (the angle ALPHA illustrated in FIG. 1) away from the normal axis NX in the direction of the m-axis of the hexagonal group-III nitride semiconductor. Accordingly, the substrate 51 has a semi-polar primary surface 51a of the hexagonal group III nitride semiconductor. In Part (a) of FIG. 5, the epitaxial substrate is depicted as a member of a substantially disk shape, but the substrate product SP can take any shape other than this shape.

In Step S102, an epitaxial substrate is formed for the group III nitride semiconductor laser device. In Step S103, as illustrated in FIG. 5A, an n-type group III nitride semiconductor layer 53 for an n-type cladding layer and a group III nitride semiconductor layer 55 for an emission layer are grown over a primary surface 51a of a substrate 51 in a growth reactor 10a. If needed, prior to growth of the n-type group III nitride semiconductor layer 53 and the group III nitride semiconductor layer 55, growth can be carried out over the primary surface 51a of a substrate 51 in the growth reactor 10a. As illustrated in Part (b) of FIG. 5, in Step S104, a p-type group III nitride semiconductor layer 57 for a p-type cladding layer is grown over the primary surface 51a of the substrate 51 in the growth reactor 10a. If needed, in Step S105, as illustrated in Part (b) of FIG. 6, a p-type group III nitride semiconductor layer 59 is grown in the growth reactor 10a after and/or before the growth of the p-type group III nitride semiconductor layer 57 so as to be in contact with the p-type group III nitride semiconductor layer 57. In Step S106, as illustrated in Part (b) of FIG. 6, a p-type group III nitride semiconductor layer 61 for a p-type contact layer is grown over a primary surface 51a of a substrate 51 after the growth of the p-type group III nitride semiconductor layer 57 in the growth reactor 10a.

An epitaxial substrate E for the group III nitride semiconductor light emitting device is provided over the primary surface 51a of the substrate 51 and includes the n-type group III nitride semiconductor layer 53 for the n-type cladding layer, the group III nitride semiconductor layer 55 for the active layer, and p-type group III nitride semiconductor layer 57 for the p-type cladding layer. The n-type group III nitride semiconductor layer 53, the group III nitride semiconductor layer 55, and p-type group III nitride semiconductor layer 57 are provided in sequence on the primary surface 51a of the substrate 51. The p-type group III nitride semiconductor layer 57 contains a p-type dopant providing an acceptor level and an n-type impurity providing a donor level. In the p-type group III nitride semiconductor layer 57, the difference (E(BAND)−E(DAP)) between the energy E(BAND) of a band-edge emission peak value in a PL spectrum of the p-type group III nitride semiconductor layer 57 for the p-type cladding layer and the energy E(DAP) of a donor-acceptor pair emission peak value in the PL spectrum is not more than 0.42 electron volts.

Figure 7:
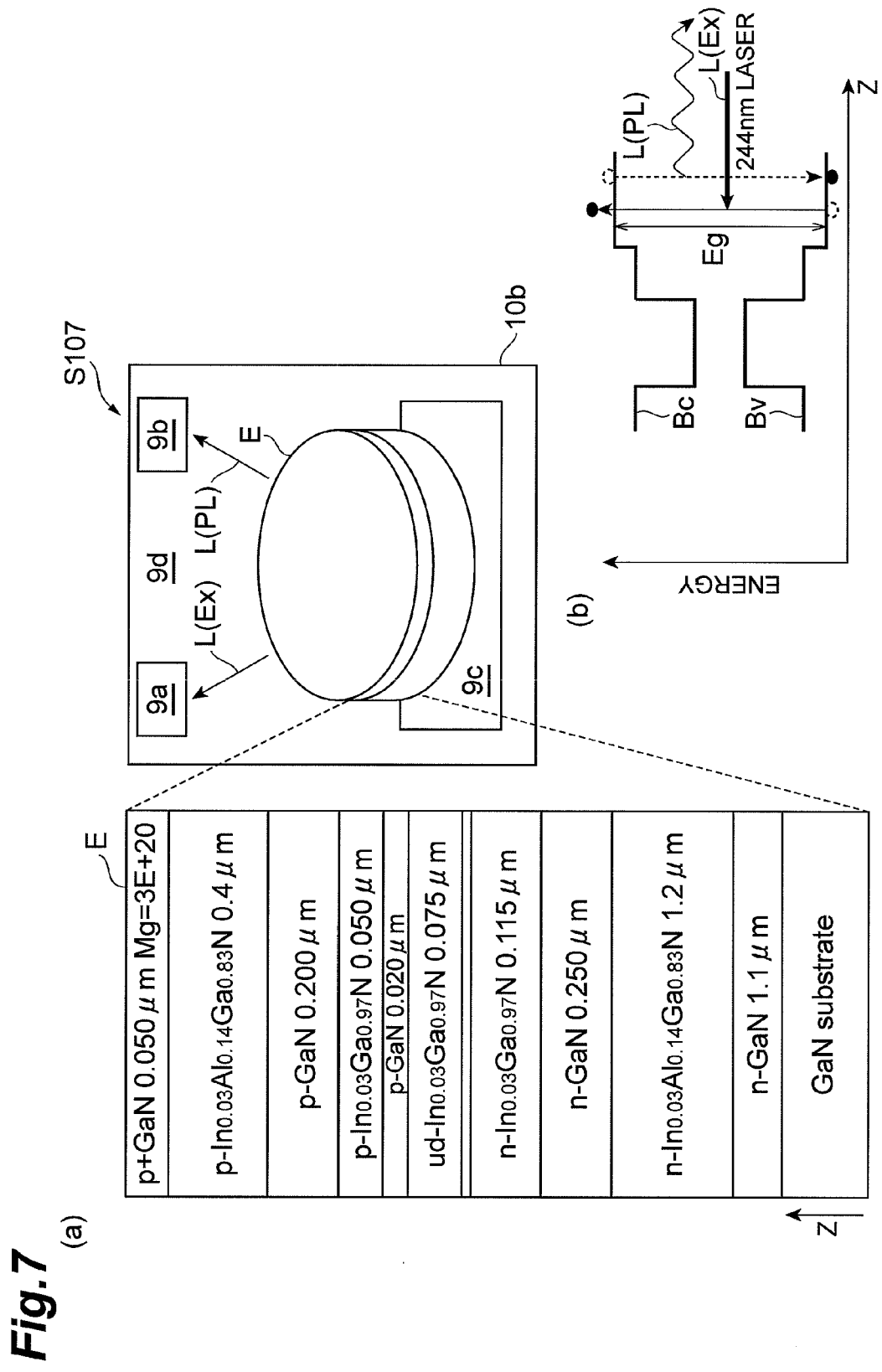
FIG. 7 is a drawing schematically illustrating steps in the method of fabricating the group III nitride semiconductor laser device in accordance with an embodiment of the present invention.

The epitaxial substrate E is formed through the above steps. Part (a) of FIG. 7 illustrates an example of the epitaxial substrate E. Substrate 51: a GaN wafer having a {20-21} plane.
Buffer layer 52: 1.1 μm thick Si doped GaN.
p-Type group III nitride semiconductor layer 53: 1.2 μm thick Si doped InAlGaN (InAlGaN: In content=0.03 and Al content=0.14).
Layers constituting the group III nitride semiconductor layer 55
  n-Side optical guide layer: 0.250 μm thick, Si doped GaN layer; 0.115 μm thick, Si doped InGaN layer (In content 0.03).
  Active layer (quantum well structure).
    Well layer: 3 nm thick, undoped InGaN (In content=0.03).
    Barrier layer: 15 nm thick, undoped GaN.
  p-Side optical guide layer: 0.075 μm thick, Mg doped InGaN layer (In content=0.03); 0.050 μnm thick, Mg doped InGaN layer (In content=0.03); 0.200 μm thick, Mg doped GaN layer.
  Electron block layer: 0.020 μm thick, Mg doped GaN layer.
p-Type group III nitride semiconductor layer 57: 0.4 μm thick, Mg doped InAlGaN (InAlGaN: In content=0.03 and Al content=0.14). p-Type group III nitride semiconductor layer 59: 0.050 μm thick, Mg doped InAlGaN (InAlGaN: In content=0.03, Al content=0.14). p-Type group III nitride semiconductor layer 61: 0.050 μm thick, Mg doped p+-type GaN.

Step S107, as illustrated in part (a) of FIG. 7, involves irradiation of the epitaxial substrate E with excitation light L(Ex) to measure a PL spectrum (PL) containing a band-edge emission of the p-type group III nitride semiconductor layer (p-type cladding layer) 57 and a donor-acceptor pair emission of the p-type cladding layer. A measuring device 10b includes an optical excitation source 9a, a detector 9b, a temperature controller 9c, and a housing 9d. As illustrated in Part (b) of FIG. 7, the excitation light L(Ex) from the optical excitation source 9a is incident on the epi-surface of the epitaxial substrate E and is absorbed by the p-type group III nitride semiconductor layer (p-type cladding layer) 57. This excitation contains both excitations between the bands and between donor-acceptor levels. The wavelength of the excitation light L(Ex) is shorter than the band-gap wavelength (band-gap Eg) in the p-type group III nitride semiconductor layer 57 for the p-type cladding layer, and, for example, Ar-SHG laser light with a wavelength of 244 nm (E=5.0 eV) can be used. The temperature controller 9c allows the PL to be measured at 100 degrees Kelvin or less, and preferably 10 degrees Kelvin or less, and more preferably at a helium temperature. The PL measurement at a low temperature enables the observation of the distinct signals from the p-type cladding layer. The PL spectra measured at 100 degrees Kelvin or less can contain distinct peaks assigned to a band-edge emission and a donor-acceptor pair emission.

Step S108 involves determination of the difference (E(BAND)−E(DAP)) between the energy E(BAND) of a band-edge emission peak value and the energy E(DAP) of a donor-acceptor pair emission peak value in the PL spectrum. The E(BAND) and the E(DAP) are represented, for example, in units of electron volts.

Step S109 involves determination of application of the following step to the epitaxial substrate E with reference to the difference (E(BAND)−E(DAP)). The determination can be made by, for example, comparing the difference (E(BAND)−E(DAP)) with the reference value.

In the fabrication method, the PL spectrum containing a band-edge emission and a donor-acceptor pair emission is measured by irradiating the p-type group III nitride semiconductor layer 57 with excitation light L(Ex) between the step of growing the epitaxial substrate E and the subsequent step. The energy E(BAND) of the band-edge emission peak value and the energy E(DAP) of the donor-acceptor pair emission peak value in the PL measurement are used to obtain the difference (E(BAND)−E(DAP)), which is used for determination of application of the following step to the epitaxial substrate. As described above, the difference (E(BAND)−E(DAP)) has a correlation with voltage characteristics (e.g. Vf) of the group III nitride semiconductor laser device. The group III nitride semiconductor laser device fabricated through these steps can improve the voltage characteristics attributed to high resistance of the p-type cladding layer.

The reference value used in Step S109 is 0.42 electron volts for the p-type cladding layer of, for example, InAlGaN. At a difference (E(BAND)−E(DAP)) of 0.42 electron volts or less, which has not been achieved before, the group III nitride semiconductor laser device having p-type InAlGaN cladding layer can provide suitable voltage characteristics.

Step S110, if the determination in Step S109 is affirmative, involves processing the epitaxial substance E for forming an electrode for the group III nitride semiconductor laser device.

Step S111, if needed, may involves reconsideration of the film-forming recipe(s) in the subsequent fabricating process of the epitaxial substrate E on a basis of the difference (E(BAND)−E(DAP)) for refinement of the deposition of the p-type cladding layer. According to the fabrication method, the reconditioned film-forming recipe(s) can be fed back to the fabrication step on a basis of the observed results of the PL spectrum of the epitaxial substrate E without waiting for the evaluation of the group III nitride semiconductor light emitting device after the formation of the electrode.

If the determination in Step S109 is not affirmative, Step S112 involves a determination not to process the epitaxial substance E for forming the electrode for the group III nitride semiconductor laser device. In this case, Step S112 involves reconsideration of the film-forming conditions in the subsequent fabricating process of the epitaxial substrate E on a basis of the difference (E(BAND)−E(DAP)) for the growth of the p-type cladding layer. According to the fabrication method, the reconditioned film-forming conditions can be immediately fed back to the fabrication step on a basis of the observed results of the photoluminescence spectrum of the epitaxial substrate E without waiting for the evaluation of the group III nitride semiconductor light emitting device after the formation of the electrode. This fabrication method is provided with prompt process control.

As described above, Step S102 of forming the epitaxial substrate involves growth of the p-type group III nitride semiconductor layer 61 on the substrate 51 for the p-type contact layer. The p-type group III nitride semiconductor layer 57 for the p-type cladding layer is provided between the p-type group III nitride semiconductor layer 61 and the group III nitride semiconductor layer 55 for an emission layer. The p-type dopant concentration of the p-type group III nitride semiconductor layer 61 is greater than that of the p-type group III nitride semiconductor layer 57, whereas the band gap of the p-type group III nitride semiconductor layer 61 is smaller than that of the p-type group III nitride semiconductor layer 57. The thickness of the p-type group III nitride semiconductor layer 61 is preferably 0.06 micrometers or less, and the p-type dopant concentration of the p-type group III nitride semiconductor layer 61 is preferably not less than $1\times10^{19}$ cm$^{-3}$.

In order to evaluate the voltage characteristics of the p-type group III nitride semiconductor layer 57 for the p-type cladding layer at high accuracy, the proportion of the cladding component contained in the photoluminescence spectrum (signal component obtained from excitation in the cladding layer) is, preferably, not less than 90%. At a thickness of the p-type group III nitride semiconductor layer 61 for the p-type contact layer of not more than 0.06 micrometers, the PL component (contact component) from the p-type group III nitride semiconductor layer 61 does not have a large proportion with respect to the PL component (cladding component) from the p-type group III nitride semiconductor layer 57, thus effectively reducing the proportion of the contact component contained in the photoluminescence spectrum to about 10% or less. At a p-type dopant concentration of the p-type group III nitride semiconductor layer 61 of $1\times10^{19}$ cm$^{-3}$ or more, the contact component from the p-type group III nitride semiconductor layer 61 does not have a large proportion with respect to the cladding component, thus effectively reducing the proportion of the contact component contained in the photoluminescence spectrum to about 10% or less. The p-type group III nitride semiconductor layer 61 for the p-type contact layer is preferably composed of p-type GaN. The contact layer composed of p-type GaN is suitable for measurement of a photoluminescence spectrum which contains distinct peaks assigned to a band-edge emission and a donor-acceptor pair emission.

Example 1

In Example 1, a semiconductor laminate for a laser diode as illustrated in Part (a) of FIG. 8 is grown on a GaN substrate having a semi-polar {20-21} plane with an off-angle of 75 degrees by metal-organic chemical vapor deposition. The raw materials used herein are as follows: trimethyl gallium (TMGa), trimethyl aluminum (TMAl), trimethyl indium (TMIn), ammonia (NH$_3$), silane (SiH$_4$), and bis(cyclopentadienyl) magnesium (Cp$_2$Mg). The n-type InAlGaN cladding layer is grown at 870 degrees Celsius. The optical guide layer is grown at 840 degrees Celsius. The InGaN emission layer is grown at 715 degrees Celsius. The p-type InAlGaN cladding layer is grown at 870 degrees Celsius. The p-type GaN contact layer is grown at 870 degrees Celsius. The p-type GaN contact layer has a thickness of 0.05 μm and a Mg concentration of $3\times10^{20}$ cm$^{-3}$.

The range of the element concentration in the p-type cladding InAlGaN layer in the group III nitride semiconductor laser diode in Example 1 is as follows:
Mg concentration: $1\times10^{19}$ cm$^{-3}$;
O concentration: $1\times10^{17}$ cm$^{-3}$.
C concentration: $1\times10^{16}$ cm$^{-3}$; and
H concentration: $2\times10^{18}$ cm$^{-3}$.
Energy difference (E(BAND)–E(DAP)): 0.39 electron volts (eV).
Forward driving voltage: 6.0 V.

Example 2

In Example 1, a multilayered semiconductor for a laser diode as illustrated in Part (b) of FIG. 8 is grown on a GaN substrate having semi-polar {20-21} plane with an off-angle of 75 degrees by metal-organic chemical vapor deposition. The n-type InAlGaN cladding layer is grown at 870 degrees Celsius. The optical guide layer is grown at 840 degrees Celsius. The InGaN emission layer is grown at 725 degrees Celsius. The p-type InAlGaN cladding layer is grown at 870 degrees Celsius. The p-type GaN contact layer is grown at 870 degrees Celsius. The p-type GaN contact layer has a double layered structure. The first GaN layer has a thickness of 0.010 μm and a Mg concentration of $3\times10^{20}$ cm$^{-3}$. The second GaN layer has a thickness of 0.04 μm and a Mg concentration of $3\times10^{19}$ cm$^{-3}$.

The range of the element concentration in p-type cladding InAlGaN layer in the group III nitride semiconductor laser diode in Example 2 is as follows:
Mg concentration: $1\times10^{19}$ cm$^{-3}$;
O concentration: $8\times10^{16}$ cm$^{-3}$;
C concentration: $3\times10^{16}$ cm$^{-3}$; and
H concentration: $1\times10^{18}$ cm$^{-3}$.
Energy difference (E(BAND)–E(DAP)): 0.39 electron volts (eV).
Forward driving voltage: 5.9 V.

Example 3

Figure 9:
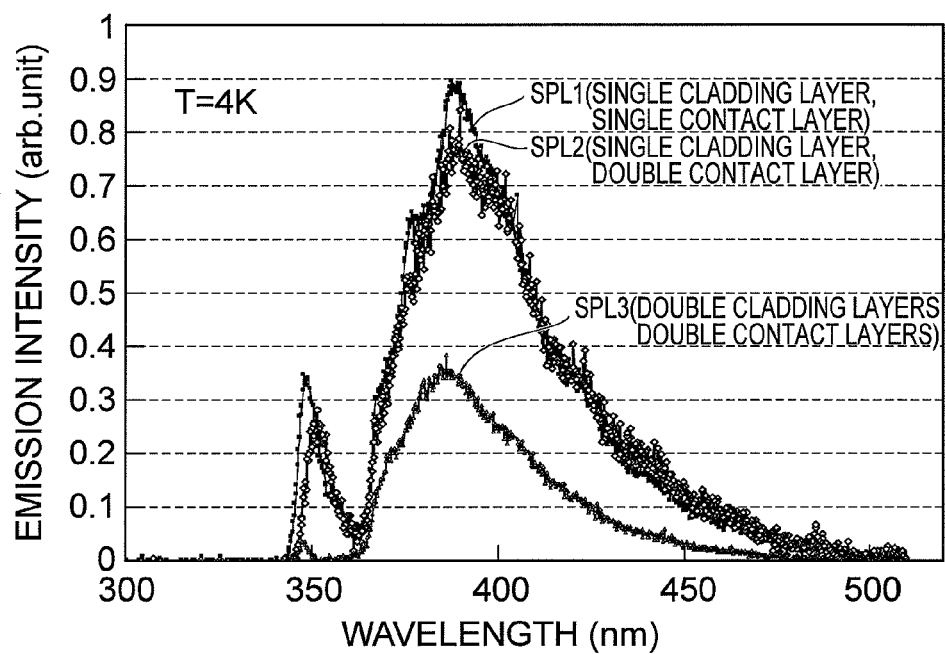
FIG. 9 is a drawing illustrating photoluminescence spectra of epitaxial substrates having different three structures for laser diodes.

FIG. 9 illustrates a PL spectrum obtained with Ar-SHG laser light. In FIG. 9, the sharp peak in the short wavelength region indicates the band-edge emission, while the big peak in the long wavelength region indicates the donor-acceptor pair (DAP) emission. FIG. 9 illustrates three spectra: SPL1, SPL2 and SPL3. The two spectra, SPL1 and SPL2, are obtained from devices having the same p-type cladding layer structure but having different contact layer structures (monolayered contact layer and double-layered contact layer). The other spectrum, SPL3, is obtained from a device having a double-layered contact layer and a double-layered p-type cladding layer structure. The PL spectrum in FIG. 9 is largely dependent on the structure of the p-type cladding layer, but is not largely dependent on the structure of p-type contact layer. This represents that the PL spectrum in FIG. 9 adequately exhibits the condition of the p-type cladding layer (InAlGaN layer in this example), although the excitation energy of the Ar-SHG laser light is absorbed in the p-type contact layer.

Figure 10:
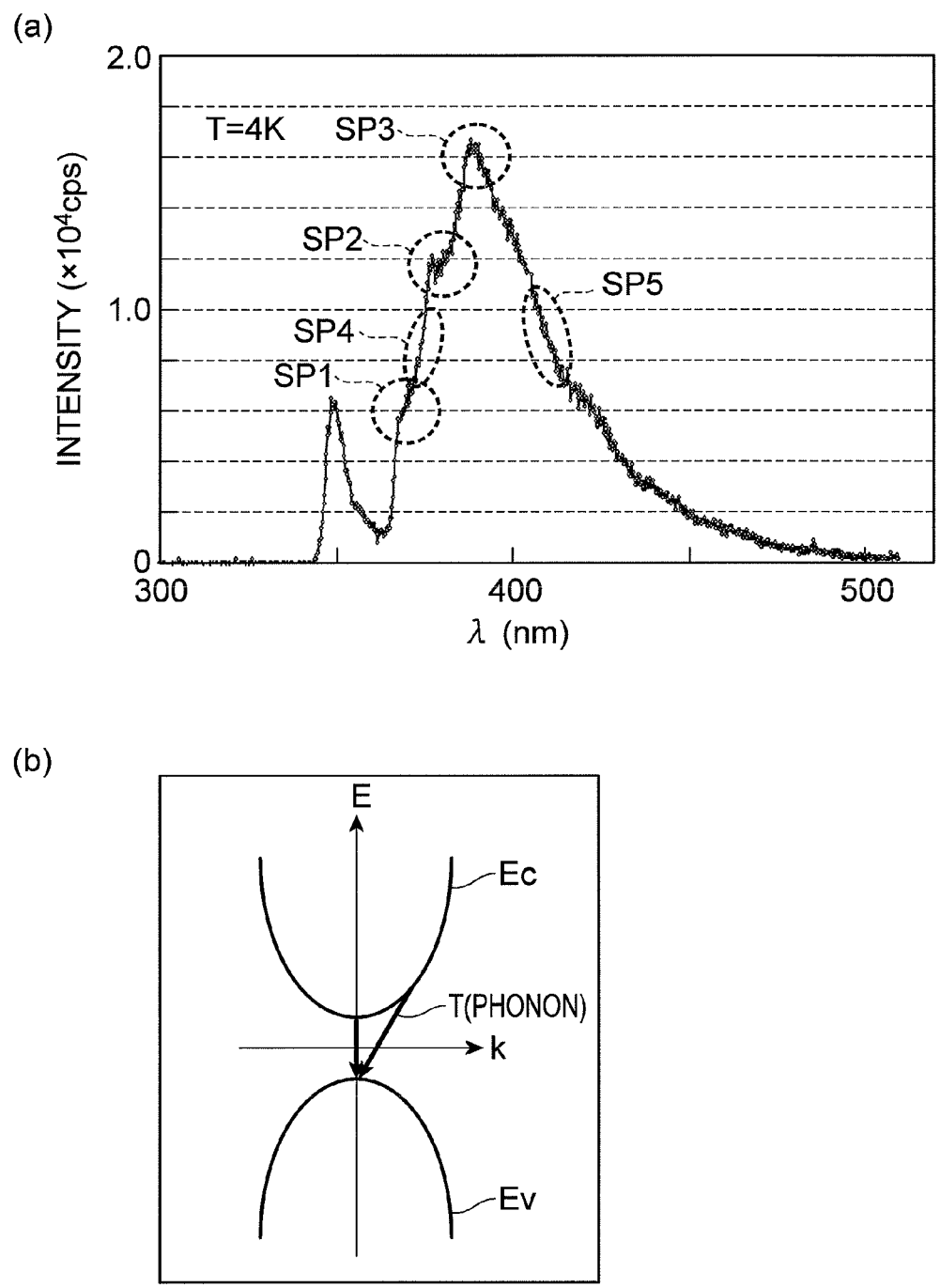
FIG. 10 is a drawing illustrating a photoluminescence spectrum containing a phonon replica.

With reference to Part (a) of FIG. 10, the PL spectrum containing the band-edge emission and the DAP emission are illustrated. This PL spectrum has a fine structure, so that the spectrum as it is or the un-preprocessed measured spectrum is not suitable for the identification of the peak. The fine structure in the un-preprocessed measured spectrum is probably caused by phonon replica. The phonon replica is, as illustrated in Part (b) of FIG. 10, emission caused by indirect transition T (PHONON) mediated by phonons, the peak of which shifts in conjunction with the band edge between the valence band Ev and the conduction band Ec, and the spectrum has peaks aligned discretely because the phonon level is discrete. Hence, the studies of the present inventors have found that the estimation of the DAP emission peak wavelength from the position of the maximum intensity in the measured spectrum without preprocessing is significantly affected by phonon replica, precluding determination of the exact position of the DAP emission peak. Accordingly, what is preferred is analysis which is not affected by the influence of the phonon replica, and the averaging process can be used for this purpose.

An exemplary averaging process will be described. Part (a) of FIG. 10 illustrates parts SP1 to SP5 of a spectrum. The parts SP1, SP2 and SP3 of the spectrum exhibit the infection of the phonon replica, while the parts SP4 and SP5 do not exhibit any infection of the phonon replica. Tangents L1(TANG) and L2(TANG) to the parts SP4 and SP5, which do not exhibit the influence of the phonon replica, are drawn (two broken lines in Part (a) of FIG. 11), and the intersection of these tangents is defined as a peak position. Part (a) of FIG. 11 illustrates both a PL spectrum PL0 without preprocessing and a PL spectrum PL (AVR) processed by a software averaging process. The wavelength of the peak position of the averaging-processed PL spectrum PL (AVR) is substantially the same as that of the intersection of the tangents of the untreated spectrum PL0, which demonstrates that the influence of the fine structure from the phonon replica can be eliminated in both processes.

In the case where the DAP emission peak wavelength is determined under the reduced influence of the phonon replica on the peak through the averaging process, the energy difference (E(BAND)−E(DAP)) exhibits a remarkably strong correlation with a driving voltage (Vf), as described above. This correlation suggests that the driving voltage (Vf) is strongly correlated with the voltage characteristics of the p-type cladding layer, demonstrating that the depth of the donor level relative to the band gap and/or the depth of the acceptor level relative to the band gap is correlated with the characteristics of the driving voltage.

Part (b) of FIG. 11 is a diagram schematically illustrating a structure of the p-type cladding layer before the amelioration and Part (c) of FIG. 11 is a diagram schematically illustrating a structure of the p-type cladding layer in accordance with an embodiment of the present invention. Parts (b) and (c) of FIGS. 11 and 11 illustrate the conduction band Ec, the valence band Ev, the average acceptor level EA (AVR) which represents a multitude of acceptor levels distributed in a certain energy range in the semiconductor, and the average donor level ED (AVR) which represents a multitude of donor levels distributed in a certain energy range in the semiconductor. As shown in Part (b) of FIG. 11, when the acceptor level on average is deep (i.e. the difference of the wavelength corresponding to energy difference (E(BAND)−E(DAP) is large), an electron is barely excited from the valence band Ev to the averaged acceptor level EA (AVR), leading to a reduction in the number of carriers (the number of holes). This probably leads to poor voltage characteristics of the p-type cladding layer. As illustrated in Part (c) of FIG. 11, when the acceptor level on average is appropriate (i.e. the difference of the wavelength corresponding to the energy difference (E(BAND)−E(DAP) is small), electrons can be excited to the valence band Ev or the averaged acceptor level EA (AVR), leading to an increase in the number of carriers (the number of holes). This probably leads to superior voltage characteristics of the p-type cladding layer.

As described above, the improved energy difference (E(BAND)−E(DAP) can extract information concerning the driving voltage (Vf). When having such a p-type cladding layer containing controlled amounts of donor and acceptor so as to obtain a predetermined energy difference (E(BAND)−E(DAP)), the group III nitride semiconductor light emitting device also has characteristics of an improved driving voltage (Vf). The energy difference is useful as an indicator for the control of the electrical characteristics of the driving voltage (Vf) of the p-type cladding layer in the stage before the process.

The embodiments of the present invention provide a group III nitride semiconductor light emitting device having a reduced forward voltage, and a method of fabricating the group III nitride semiconductor light emitting device. The embodiments further provide an epitaxial substrate for the group III nitride semiconductor light emitting device having a reduced forward voltage.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A group III nitride semiconductor light emitting device comprising:
    an n-type cladding layer provided on a primary surface of a substrate, the n-type cladding layer comprising an n-type group III nitride semiconductor;
    an active layer provided on the primary surface of the substrate, the active layer comprising a group III nitride semiconductor; and
    a p-type cladding layer provided on the primary surface of the substrate, the p-type cladding layer comprising a p-type group III nitride semiconductor,
    the active layer being provided between the n-type cladding layer and the p-type cladding layer;
    the n-type cladding layer, the active layer, and the p-type cladding layer being arranged along a normal axis of the primary surface of the substrate;
    the p-type cladding layer being doped with a p-type dopant;
    the p-type cladding layer containing an n-type impurity;
    a concentration of the p-type dopant being greater than that of the n-type impurity; and
    wherein the p-type cladding layer comprises acceptor levels provided by the p-type dopant, the p-type cladding layer comprises donor levels provided by the n-type impurity, and the p-type cladding layer has a distribution of the donor levels and a distribution of the acceptor levels in a band gap energy of the p-type cladding layer, the distributions define a difference (E(BAND)−E(DAP)) between an energy E(BAND) of a band-edge emission peak value in a photoluminescence spectrum of the p-type cladding layer and an energy E(DAP) of a donor-acceptor pair emission peak value in the photoluminescence spectrum being not more than 0.42 electron volts, the energy E(BAND) of the band-edge emission and the energy E(DAP) of a donor-acceptor pair emission being represented in units of electron volts;
    a c-axis of the n-type group III nitride semiconductor of the n-type cladding layer tilting relative to the normal axis;
    a c-axis of the p-type group III nitride semiconductor of the p-type cladding layer tilting relative to the normal axis, and
    the p-type cladding layer contains hydrogen, and a hydrogen concentration of the p-type cladding layer is not more than $4 \times 10^{18}$ cm$^{-3}$.

2. The group III nitride semiconductor light emitting device according to claim 1,
    wherein the p-type dopant comprises magnesium, and the magnesium concentration is not less than $3 \times 10^{18}$ cm$^{-3}$.

3. The group III nitride semiconductor light emitting device according to claim 1,
    wherein the n-type impurity comprises oxygen, and the oxygen concentration is nor more than $6 \times 10^{17}$ cm$^{-3}$.

4. The group III nitride semiconductor light emitting device according to claim 1,
    wherein the p-type cladding layer comprises an InAlGaN layer, and
    the InAlGaN layer has a thickness of not less than 180 nm.

5. The group III nitride semiconductor light emitting device according to claim 1, wherein the n-type cladding layer comprises an InAlGaN layer.

6. The group III nitride semiconductor light emitting device according to claim 1,
wherein an angle formed between the normal axis and the c-axis of the p-type group III nitride semiconductor of the p-type cladding layer is in one of a range of 10 degrees to 80 degrees and a range of 100 degrees to 170 degrees.

7. The group III nitride semiconductor light emitting device according to claim 1,
wherein an angle formed between the normal axis and the c-axis of the p-type group III nitride semiconductor of the p-type cladding layer is in one of a range of 63 degrees to 80 degrees and a range of 100 degrees to 117 degrees.

8. The group III nitride semiconductor light emitting device according to claim 1, wherein an emission spectrum of the active layer has a peak wavelength in a range of 500 nm to 580 nm.

9. The group III nitride semiconductor light emitting device according to claim 1, further comprising a p-type contact layer, the p-type contact layer being provided on the p-type cladding layer,
wherein a thickness of the p-type contact layer is 0.06 micrometers or less;
the p-type contact layer comprises a p-type group III nitride semiconductor;
a band gap of the p-type group III nitride semiconductor of the p-type contact layer is smaller than that of the p-type group III nitride semiconductor of the p-type cladding layer; and
a p-type dopant concentration of the p-type contact layer is greater than a p-type dopant concentration of the p-type cladding layer.

10. The group III nitride semiconductor light emitting device according to claim 9,
wherein the p-type contact layer comprises p-type GaN, and
the p-type dopant concentration of the p-type contact layer is not less than $1 \times 10^{19}$ cm$^{-3}$.

11. The group III nitride semiconductor light emitting device according to claim 9,
wherein the p-type contact layer comprises a first group III nitride semiconductor layer of p-type conductivity and a second group III nitride semiconductor layer of p-type conductivity;
the second group III nitride semiconductor layer is provided between the first group III nitride semiconductor layer and the p-type cladding layer;
a p-type dopant concentration of the first group III nitride semiconductor layer is greater than a p-type dopant concentration of the second group III nitride semiconductor layer;
a p-type dopant concentration of the p-type cladding layer is smaller than the p-type dopant concentration of the second group III nitride semiconductor layer; and
the group III nitride semiconductor light emitting device further comprises an anode electrode in contact with the first group III nitride semiconductor layer.

12. The group III nitride semiconductor light emitting device according to claim 1,
the primary surface of the substrate comprises group III nitride, and
a normal axis of the primary surface of the substrate tilts relative to a c-axis of the group III nitride of the substrate.

13. The group III nitride semiconductor light emitting device according to claim 1,
the p-type cladding layer contains a carbon impurity, and the carbon impurity concentration is not more than $4 \times 10^{16}$ cm$^{-3}$.

14. The group III nitride semiconductor light emitting device according to claim 1, further comprising a monitor semiconductor layer in contact with the p-type cladding layer;
wherein material of the monitor semiconductor layer is the same as the material of the p-type cladding layer;
a p-type dopant concentration of the monitor semiconductor layer is smaller than a p-type dopant concentration of the p-type cladding layer; and
a thickness of the monitor semiconductor layer is lower than a thickness of the p-type cladding layer.

15. The group III nitride semiconductor light emitting device according to claim 14,
wherein the thickness of the monitor semiconductor layer is in a range of 5 nm to 40 nm.

16. The group III nitride semiconductor light emitting device according to claim 14, wherein the p-type dopant concentration of the monitor semiconductor layer is in a range of not less than $1 \times 10^{17}$ cm$^{-3}$ and less than $1 \times 10^{18}$ cm$^{-3}$.

17. A group III nitride semiconductor light emitting device comprising:
an n-type cladding layer provided on a primary surface of a substrate, the n-type cladding layer comprising an n-type group III nitride semiconductor;
an active layer provided on the primary surface of the substrate, the active layer comprising a group III nitride semiconductor;
a p-type cladding layer provided on the primary surface of the substrate, the p-type cladding layer comprising a p-type group III nitride semiconductor; and
a monitor semiconductor layer in direct contact with the p-type cladding layer, the p-type cladding layer being provided between the monitor semiconductor layer and the active layer, a material of the monitor semiconductor layer being the same as the material of the p-type cladding layer; a p-type dopant concentration of the monitor semiconductor layer being smaller than a p-type dopant concentration of the p-type cladding layer, a thickness of the monitor semiconductor layer being lower than a thickness of the p-type cladding layer, the thickness of the minor semiconductor layer is in a range of 5 nm to 40 nm, and the p-type dopant concentration of the monitor semiconductor layer is in a range of not less than $1 \times 10^{17}$ cm$^{-3}$ and less than $1 \times 10^{18}$ cm$^{-3}$;
the active layer being provided between the n-type cladding layer and the p-type cladding layer;
the n-type cladding layer, the active layer, and the p-type cladding layer being arranged along a normal axis of the primary surface of the substrate;
the p-type cladding layer being doped with a p-type dopant, the p-type dopant providing an acceptor level;
the p-type cladding layer containing an n-type impurity, the n-type impurity providing a donor level;
a concentration of the p-type dopant being greater than that of the n-type impurity; and
a difference (E(BAND)−E(DAP)) between an energy E(BAND) of a band-edge emission peak value in a photoluminescence spectrum of the p-type cladding layer and an energy E(DAP) of a donor-acceptor pair emission peak value in the photoluminescence spectrum being not more than 0.42 electron volts, the energy E(BAND) of the band-edge emission and the energy E(DAP) of a donor-acceptor pair emission being represented in units of electron volts;
a c-axis of the n-type group III nitride semiconductor of the n-type cladding layer tilting relative to the normal axis; and
a c-axis of the p-type group III nitride semiconductor of the p-type cladding layer tilting relative to the normal axis.

* * * * *